US012550317B2

(12) United States Patent
Kang et al.

(10) Patent No.: US 12,550,317 B2
(45) Date of Patent: Feb. 10, 2026

(54) DIRECT WORD LINE CONTACT AND METHODS OF MANUFACTURE FOR 3D MEMORY

(71) Applicant: Applied Materials, Inc., Santa Clara, CA (US)

(72) Inventors: Chang Seok Kang, Santa Clara, CA (US); Tomohiko Kitajima, San Jose, CA (US); Sung-Kwan Kang, Santa Clara, CA (US); Gill Yong Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 368 days.

(21) Appl. No.: 18/141,570

(22) Filed: May 1, 2023

(65) Prior Publication Data

US 2023/0371246 A1 Nov. 16, 2023

Related U.S. Application Data

(60) Provisional application No. 63/342,386, filed on May 16, 2022.

(51) Int. Cl.
*H10B 12/00* (2023.01)

(52) U.S. Cl.
CPC .......... *H10B 12/488* (2023.02); *H10B 12/02* (2023.02)

(58) Field of Classification Search
CPC .................................................. H10B 12/488
See application file for complete search history.

(56) References Cited

U.S. PATENT DOCUMENTS

| 2019/0341251 A1 | 11/2019 | Lee |
| 2020/0083225 A1 | 3/2020 | Ma et al. |
| 2021/0159229 A1 | 5/2021 | Gomes et al. |
| 2021/0249415 A1 | 8/2021 | Kang et al. |

(Continued)

FOREIGN PATENT DOCUMENTS

| KR | 20130040364 A | 4/2013 |
| KR | 20220001467 A | 1/2022 |

OTHER PUBLICATIONS

Chen, Shih-Hung, et al., "A Highly Scalable 8-layer Vertical Gate 3D NAND with Split-page Bit Line Layout and Efficient Binary-sum MiLC (Minimal Incremental Layer Cost) Staircase Contacts", Macronix International Co., Ltd., Downloaded on Feb. 17, 2022.

(Continued)

*Primary Examiner* — Amar Movva
(74) *Attorney, Agent, or Firm* — SERVILLA WHITNEY LLC

(57) ABSTRACT

Described are memory devices having an array region and an extension region adjacent the array region. The array region includes at least two unit cells stacked vertically. The extension region includes a memory stack and a plurality of word line contacts. The memory stack comprises alternating layers of at least one conductive layer, a semiconductor layer, and an insulating layer. The plurality of word line contacts extend through the memory stack to the at least one conductive layer. Each of the plurality of word line contacts have a height that is different than the height of an adjacent word line contact. Each of the plurality of word line contacts has a metallization layer on the top surface. Methods of forming a memory device are described.

9 Claims, 30 Drawing Sheets

(56) References Cited

U.S. PATENT DOCUMENTS

2021/0272604 A1    9/2021    Kang et al.
2021/0287991 A1    9/2021    Sun et al.

OTHER PUBLICATIONS

Vahedi, Vahid, "Etch Challenges and Solutions for 3D NAND", Lam Research Corp., SEMICON China, Mar. 15, 2016.
PCT International Search Report and Written Opinion in PCT/US2023/020939 dated Aug. 29, 2023, 11 pages.

A

B

DIRECT WORD LINE CONTACT AND METHODS OF MANUFACTURE FOR 3D MEMORY

CROSS-REFERENCE TO RELATED APPLICATIONS

This application claims priority to U.S. Provisional Application No. 63/342,386, filed May 16, 2022, the entire disclosure of which is hereby incorporated by reference herein.

TECHNICAL FIELD

Embodiments of the present disclosure pertain to the field of electronic devices and electronic device manufacturing. More particularly, embodiments of the disclosure provide a three-dimensional (3D) dynamic random-access memory cell.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices. The formation of a low resistance contact between the active area and the 3D DRAM bottom electrode is essential for performance of the device.

DRAM is composed of hundreds of sub-blocks. For each sub-block, word lines (WL) and bit lines (BL) are connected with controlling circuits. Multiple cells are stacked in a 3D DRAM. Every word line of each stack should have a contact to connect the word line with controlling circuits in a sub-array. nWL of contacts are necessary in each row of WLs when nWL memory cells are stacked in 3D DRAM. The reduction in WL contact area is critical to decrease a chip area.

There is a need in the art, therefore, for memory devices and methods of forming memory devices that have a reduced chip area.

SUMMARY

One or more embodiments of the disclosure are directed to a memory device. In one or more embodiments, a memory device comprises: an array region comprising at least two unit cells stacked vertically; and an extension region adjacent the array region, the extension region comprising a memory stack and a plurality of word line contacts, the memory stack comprising alternating layers of at least one conductive layer, a semiconductor layer, and an insulating layer, the plurality of word line contacts extending through the memory stack to the at least one conductive layer, each of the plurality of word line contacts having a height that is different than the height of an adjacent word line contact and each of the plurality of word line contacts having a metallization layer on a top surface.

Additional embodiments of the disclosure are directed to methods of forming a memory device. In one or more embodiments, a method of forming a memory device comprises: forming a memory stack on a substrate, the memory stack comprising alternating layers of at least one sacrificial layer, an insulating layer, and a semiconductor layer; patterning the memory stack to form a plurality of openings extending through the memory stack, each of the plurality of openings have a depth different from an adjacent opening; depositing an etch stop layer and a sacrificial fill layer in each of the plurality of openings; replacing the at least one sacrificial layer of the unit cells with at least one conductive layer; removing the sacrificial fill layer in each of the plurality of openings to form a plurality of contact openings; removing a bottom portion of the etch stop layer; and depositing a conductive material in each of the plurality of contact openings to form a plurality of word line contacts, each of the plurality of word line contacts having a height different than the height of an adjacent word line contact.

Further embodiments of the disclosure are directed to a non-transitory computer readable medium including instructions, that, when executed by a controller of a processing chamber, causes the processing chamber to perform the operations of: form a memory stack on a substrate, the memory stack comprising alternating layers of at least one sacrificial layer, an insulating layer, and a semiconductor layer; pattern the memory stack to form a plurality of openings extending through the memory stack, each of the plurality of openings have a depth different from an adjacent opening; deposit an etch stop layer and a sacrificial fill layer in each of the plurality of openings; replace the at least one sacrificial layer of the unit cells with at least one conductive layer; remove the sacrificial fill layer in each of the plurality of openings to form a plurality of contact openings; remove a bottom portion of the etch stop layer; and deposit a conductive material in each of the plurality of contact openings to form a plurality of word line contacts, each of the plurality of word line contacts having a height different than the height of an adjacent word line contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
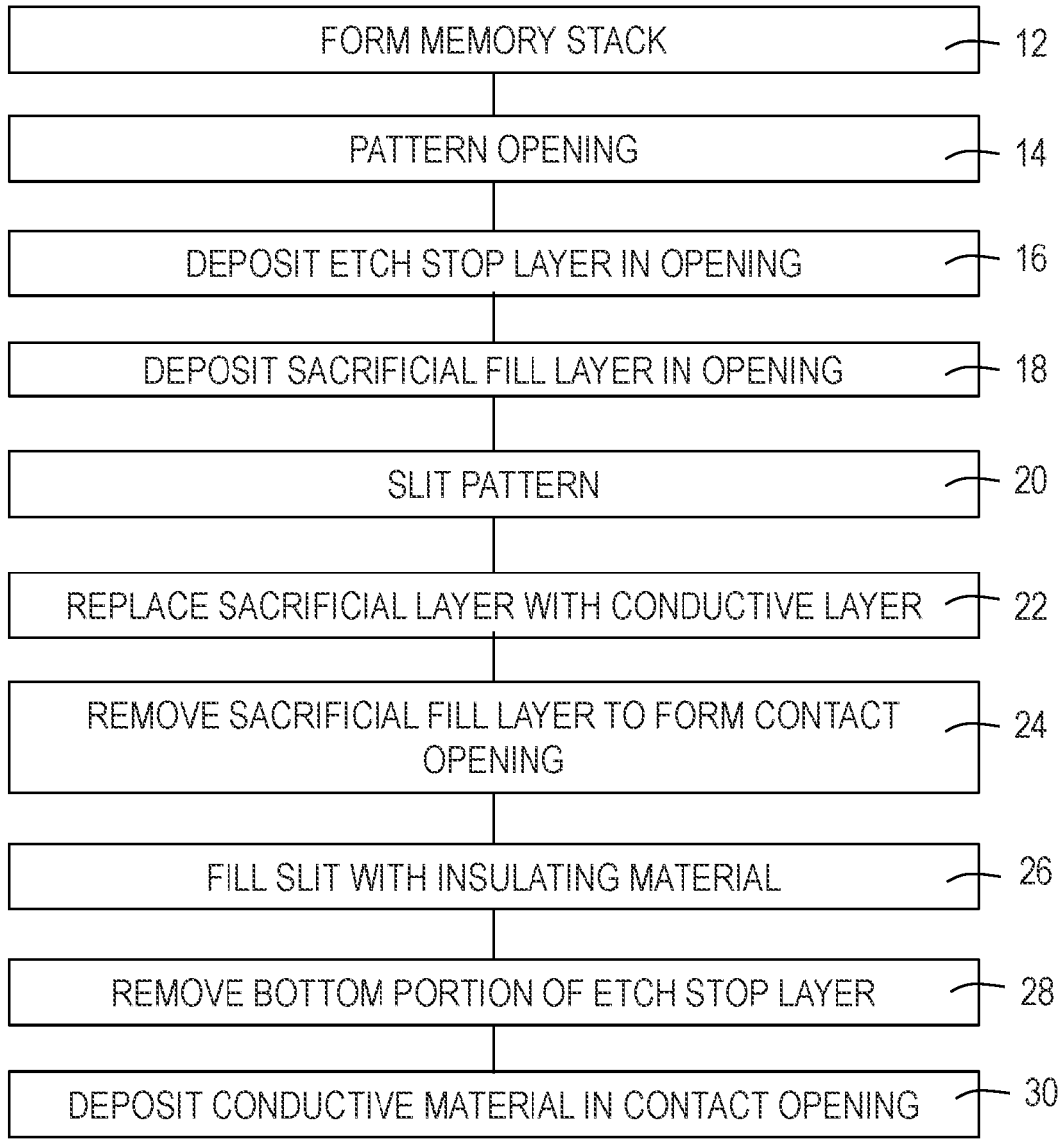
FIG. 1 illustrates a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

As used in this specification and the appended claims, the terms "precursor", "reactant", "reactive gas" and the like are used interchangeably to refer to any gaseous species that can react with the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., aluminum precursor) is pulsed into the reaction zone followed by a first time delay. Next, a second precursor or compound B (e.g., oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells.

Traditionally, DRAM cells have recessed high work-function metal structures in buried word line structure. In a DRAM device, a bit line is formed in a metal level situated above the substrate, while the word line is formed at the polysilicon gate level at the surface of the substrate. In the buried word line (bWL), a word line is buried below the surface of a semiconductor substrate using a metal as a gate electrode.

In current 3D DRAM devices, a staircase structure is created, and word line contacts are formed on the staircase. In order to prevent a short between the staircase and the word line contacts, however, the contact holes must have a large critical dimension, which is problematic during manufacturing. In one or more embodiments, memory devices are provided which advantageously have word line contacts of varying heights where the word line contact connects a metallization layer with a conductive layer of a unit cell, forming a chip area that is reduced and decreasing processing difficulties. Thus, the method of one or more embodiments does not require the formation of a staircase structure. In the word line contacts of one or more embodiments, only shorting between contact to contact needs to be considered. Additionally, the contact structure of one or more embodiments advantageously works as a support to prevent collapse of the mold during the gate replacement process.

In one or more embodiments, metal deposition and other processes can be carried out in an isolated environment (e.g., a cluster process tool). Accordingly, some embodiments of the disclosure provide integrated tool systems with related process modules to implement the methods.

FIG. 1 illustrates a process flow diagram for a method 10 that can include any or all of the processes illustrated. Additionally, the order of the individual processes can be varied for some portions. The method 10 can start at any of the enumerated processes without deviating from the disclosure. With reference to FIG. 1, at operation 12, a memory stack is formed. At operation 14, an opening is patterned into the memory stack. At operation 16, an etch stop layer is deposited through the opening. At operation 18, a sacrificial fill layer is deposited on the etch stop layer in the opening. At operation 20, the memory stack is slit patterned. At operation 22, the sacrificial layer of the memory stack is removed and replaced with a conductive layer. At operation 24, the sacrificial fill layer is removed to form a contact opening. At operation 26, the slit is filled with an insulating material. At operation 28, the bottom portion of the etch stop layer is removed. At operation 30, a conductive material is deposited in the contact opening to form a word line contact.

FIGS. 2A through 22B illustrate cross-sectional views of a memory device during processing according to the method of one or more embodiments.

Figure 2A:
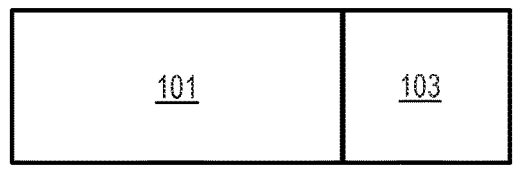
FIG. 2A illustrates a cross-sectional view of a memory device according to one or more embodiments of the disclosure.
Figure 2B:
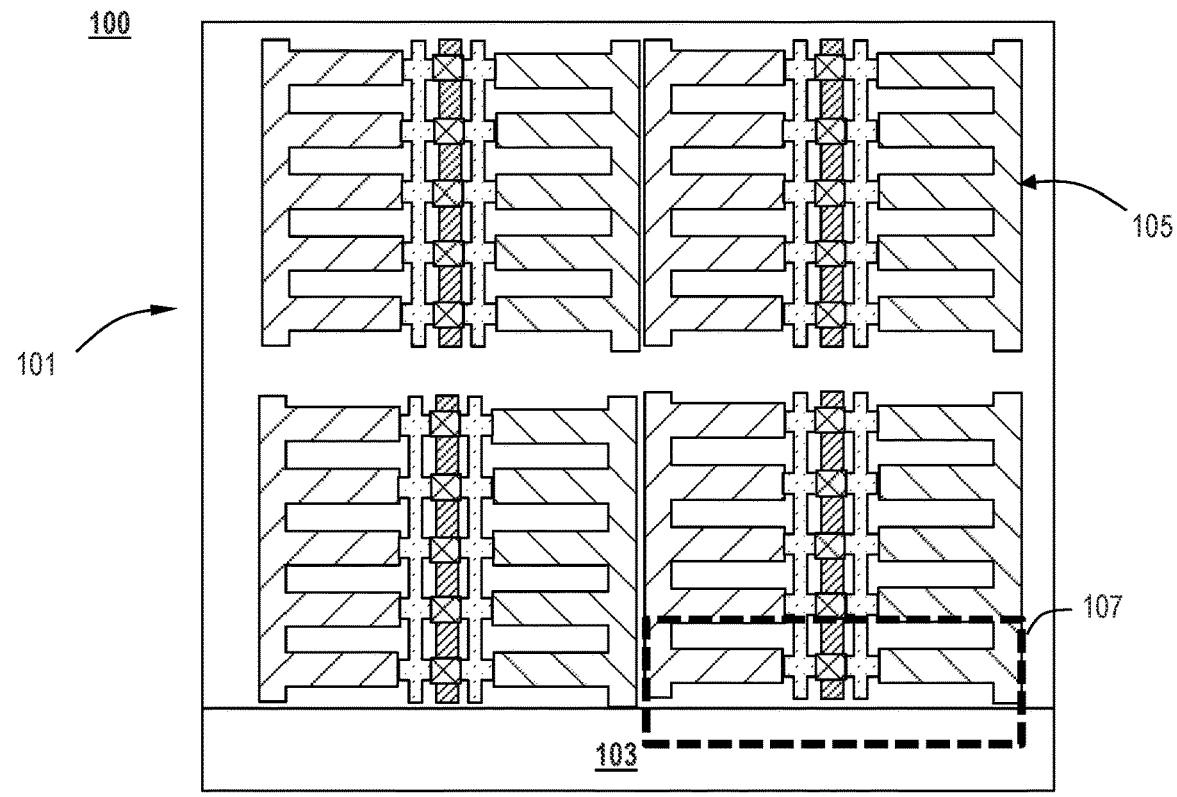
FIG. 2B illustrates a cross-sectional view of a memory device according to one or more embodiments of the disclosure.
Figure 2C:
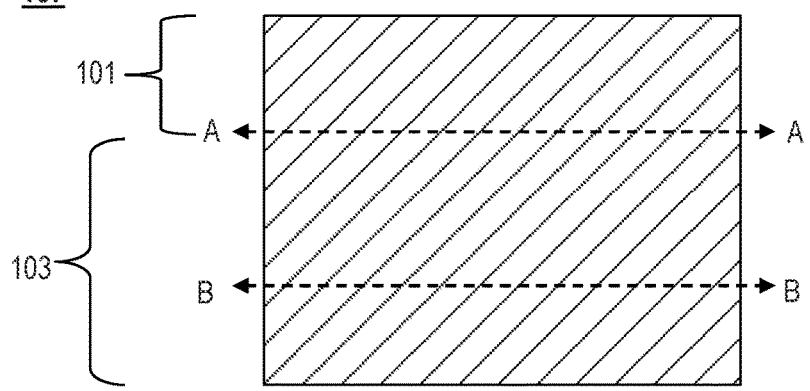
FIG. 2C illustrates a cross-sectional view of a memory device according to one or more embodiments of the disclosure.

With reference to FIGS. 2A-2C, a 3D DRAM device 100 includes an array region 101 and an extension region 103 adjacent to the array region 101. The extension region 103 connects memory cells with the non-array node of the DRAM device. In one or more embodiments, the array region 101 includes at least two unit cells 105 vertically stacked. The unit cell 105 includes a transistor and a cell capacitor. In one or more embodiments, the extension region 103 comprises a memory stack 111 and a plurality of word line contacts 136. In one or more embodiments, the memory stack 111 does not comprise a staircase structure, but instead has a plurality of word line contacts 136 that are each different in height than the height of the adjacent contact.

Figure 3A:
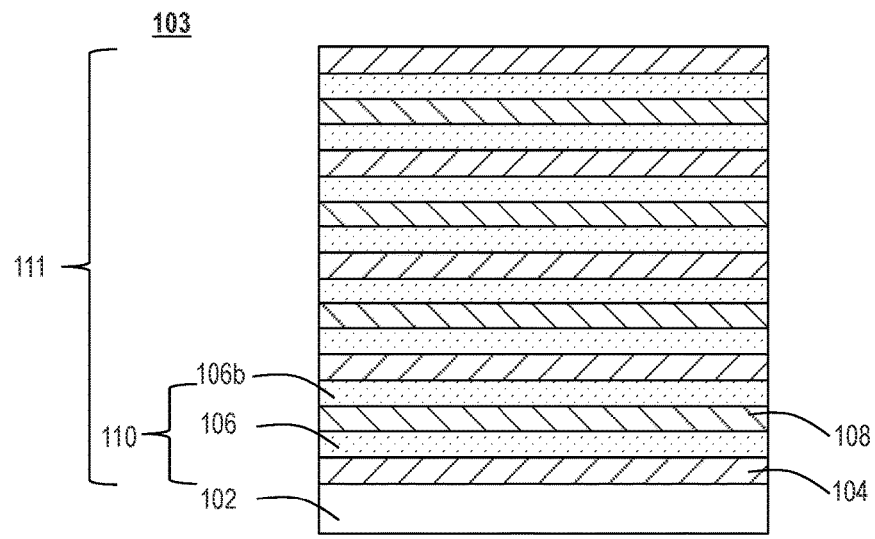
FIG. 3A illustrates a cross-sectional view of a memory device according to one or more embodiments of the disclosure.
Figure 3B:
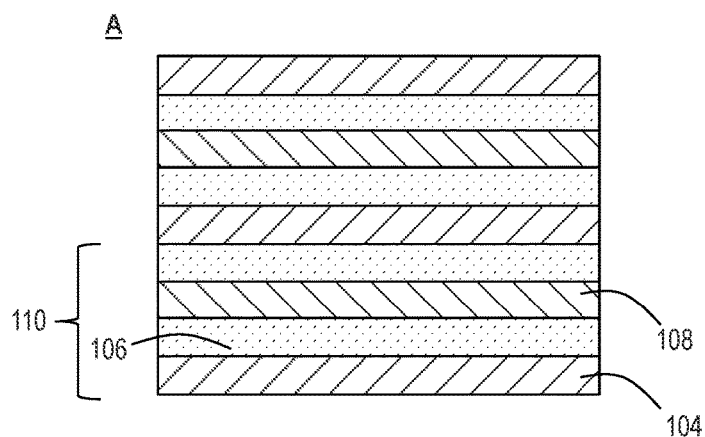
FIG. 3B illustrates a cross-sectional view of a memory device according to one or more embodiments of the disclosure.
Figure 3C:
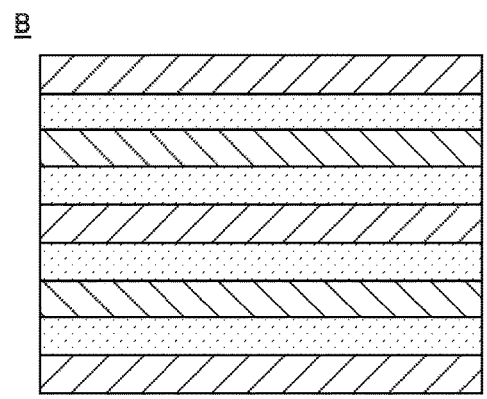
FIG. 3C illustrates a cross-sectional view of a memory device according to one or more embodiments of the disclosure.

Referring to FIGS. 3A-3C, an initial or starting mold of the extension region 103 is formed in accordance with one or more embodiments of the disclosure. FIG. 3B is a view along line A of FIG. 2C, and FIG. 3C is a view along line B of FIG. 2C. In some embodiments, the electronic device 103 shown in FIG. 3A is formed on a bare substrate (not illustrated) in layers. In one or more embodiments, the electronic device of FIG. 3A is made up of a substrate 102 and a unit stack 110. In one or more embodiments, the unit stack 110 includes an insulating layer 104, at least one sacrificial layer 106, and a semiconductor layer 108. In some embodiments, the unit stack 110 includes an insulating layer 104, a first sacrificial layer 106 on the insulating layer 104, a semiconductor layer 108 on the first sacrificial layer 106, and a second sacrificial layer 106*b* on the semiconductor layer 108. Repeating unit stacks 110 stacked vertically on top of one another form a memory stack 111 on the substrate. The memory stack 111 includes alternating layers of the insulating layer 104, the least one sacrificial layer 106, and the semiconductor layer 108.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, an insulating layer 104 is on a top surface of the substrate 102. The insulating layer 104 can be formed by any suitable technique known to the skilled artisan and can be made from any suitable material. In one or more embodiments, the insulating layer 104 comprises silicon oxide ($SiO_x$).

In one or more embodiments, a first sacrificial layer 106 is on the insulating layer 104. The first sacrificial layer 106 may comprise any suitable material known to the skilled artisan. In one or more embodiments, the first sacrificial layer 106 comprises silicon nitride (SiN).

In one or more embodiments, a semiconductor layer 108 may be formed on the first sacrificial layer 106. The semiconductor layer 108 may also be referred to as the active layer or the memory layer.

As used herein, the term "active" or "memory layer" refers to a layer of material in which a channel, a bit line, a word line, or a capacitor can be made. In one or more embodiments, the active layer, or the semiconductor layer 108 comprises one or more of silicon or doped silicon. In some embodiments, the semiconductor layer 108 may comprise a semiconductor material that is a doped material, such as n-doped silicon (n-Si), or p-doped silicon (p-Si). In some embodiments, the semiconductor layer 108 may be doped using any suitable process such as an ion implantation process. As used herein, the term "n-type" refers to a semiconductor layer 108 that is created by doping with an electron donor element during manufacture. The term n-type comes from the negative charge of the electron. In n-type semiconductor material layers, electrons are the majority carriers and holes are the minority carriers. As used herein, the term "p-type" refers to the positive charge of a well (or hole). As opposed to n-type semiconductor materials, p-type semiconductor materials have a larger hole concentration than electron concentration. In p-type semiconductor materials, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the semiconductor layer 108 comprises several different conductive or semiconductor materials.

The first sacrificial layer 106 and the insulating layer 104 may be formed on a substrate 102 and can be made of any suitable material. In some embodiments, one or more of the first sacrificial layer 106 and the insulating layer 104 may be removed and replaced in later processes. In some embodiments, one or more of the first sacrificial layer 106 and the insulating layer 104 are not removed and remain within the memory device 100. In this case, the term "sacrificial" has an expanded meaning to include permanent layers and may be referred to as the conductive layer. In one or more embodiments, one or more of the first sacrificial layer 106 and the insulating layer 104 comprise a material that can be removed selectively versus the layers of the neighboring memory stack.

The memory stack 111 in the illustrated embodiment comprises a plurality of alternating sacrificial layers 106, insulating layers 104, and semiconductor layers 108. While the memory stack 111, illustrated in FIG. 3A, has four sets of alternating sacrificial layers 106, insulating layers 104, and semiconductor layers 108, one of skill in the art recognizes that this is merely for illustrative purposes only. The memory stack 111 may have any number of alternating sacrificial layers 106, insulating layers 104, and semiconductor layers 108. For example, in some embodiments, the memory stack 111 comprises 192 pairs of alternating sacrificial layers 106, insulating layers 104, and semiconductor layers 108. In other embodiments, the memory stack 111 comprises greater than 50 pairs of alternating sacrificial layers 106, insulating layers 104, and semiconductor layers 108, or greater than 100 pairs of alternating sacrificial layers 106, insulating layers 104, and semiconductor layers 108, or greater than 300 pairs of alternating sacrificial layers 106, insulating layers 104, and semiconductor layers 108.

In one or more embodiments, sequential depositions are used to form many active area regions. In one or more embodiments, alternating layers of films, e.g., oxide-polysilicon, polysilicon-nitride, oxide-nitride, silicon-silicon germanium, oxide-nitride-silicon-nitride, are deposited.

In one or more embodiments, the sacrificial layers 106 independently comprise an insulating material. In one or more embodiments, the sacrificial layers 106 comprises a nitride material, e.g., silicon nitride, and the insulating layer 104 comprises an oxide material, e.g., silicon oxide. The sacrificial layers 106 comprise a material that is etch selective relative to the insulating layer 104 and the semiconductor layer 108 so that the sacrificial layers 106 can be removed without substantially affecting the insulating layer 104 and the semiconductor layer 108. In one or more embodiments, the sacrificial layers 106 comprise silicon nitride (SiN). In one or more embodiments, the insulating layer 104 comprises silicon oxide ($SiO_x$). In one or more embodiments the sacrificial layers 106, the insulating layer 104, and the semiconductor layer 108 are deposited by chemical vapor deposition (CVD) or physical vapor deposition (PVD).

The individual alternating layers may be formed to any suitable thickness. In some embodiments, the thickness of each sacrificial layer 106 is approximately equal. In one or more embodiments, each sacrificial layer 106 has a sacrificial layer thickness. In some embodiments, the thickness of each insulating layer 104 is approximately equal. As used in this regard, thicknesses which are approximately equal are within +/−5% of each other. In some embodiments, a semiconductor layer 108, e.g., silicon, is formed between the first sacrificial layer 106 and the second sacrificial layer 106b of the unit stack 110. The thickness of the semiconductor layer 108 may be relatively thin as compared to the thickness of the sacrificial layers 106 and the insulating layer 104.

In one or more embodiments, the insulating layer 104 has a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the insulating layer 104 has a thickness in the range of from about 0.5 to about 40 nm. In one or more embodiments, the sacrificial layers 106 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the sacrificial layer 106 has a thickness in the range of from about 0.5 to about 40 nm.

Figure 4A:
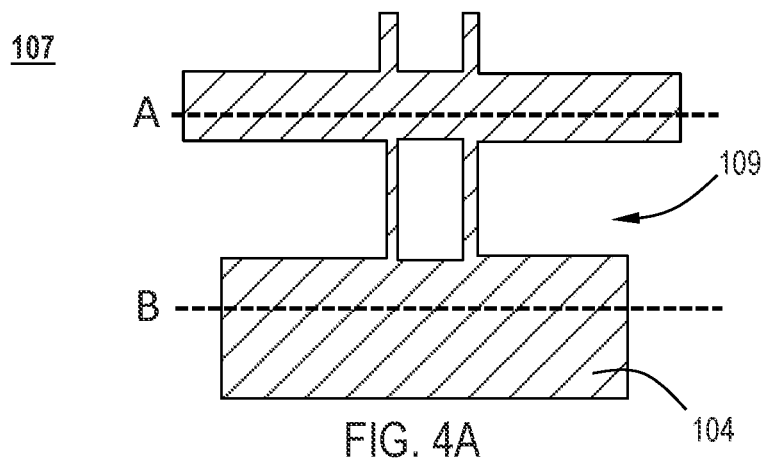
FIG. 4A illustrates a cross-sectional view of a memory device according to one or more embodiments of the disclosure.
Figure 4B:
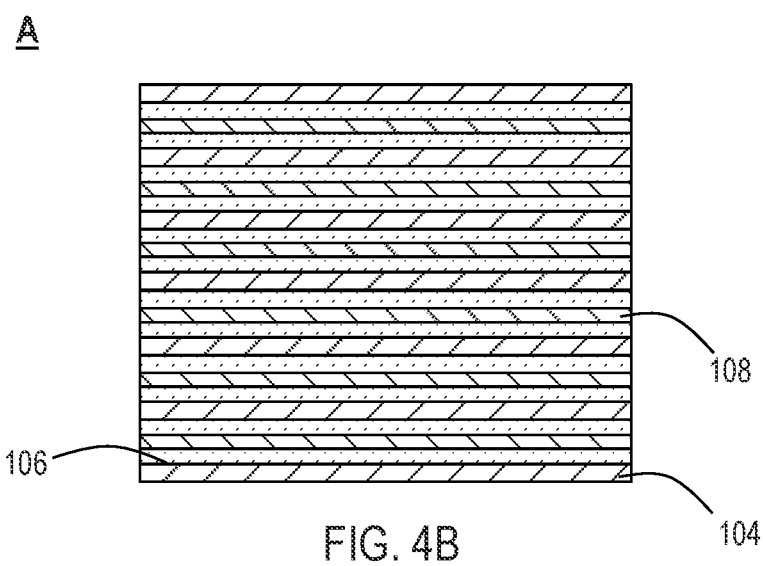
FIG. 4B illustrates a cross-sectional view of a memory device according to one or more embodiments of the disclosure.
Figure 4C:
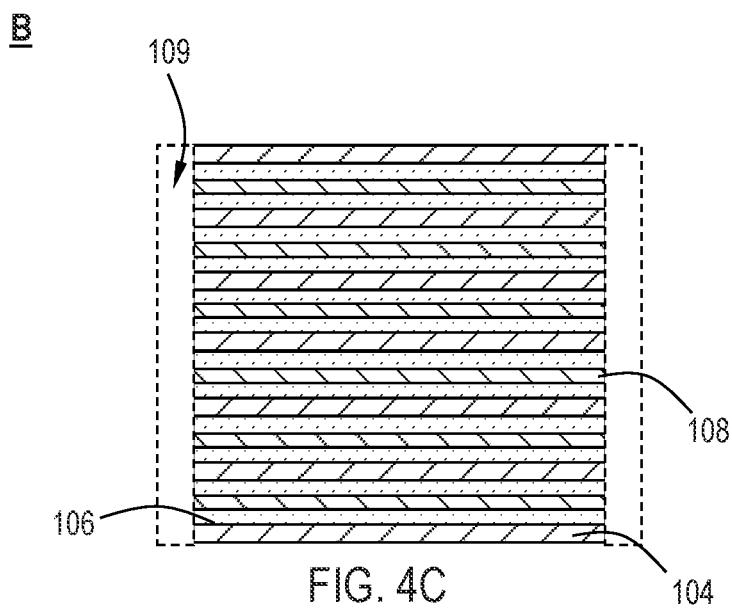
FIG. 4C illustrates a cross-sectional view of a memory device according to one or more embodiments of the disclosure.

With reference to FIGS. 4A to 4C, the device is patterned to form an isolation opening 109 for the isolation of cell-to-cell.

Figure 5A:
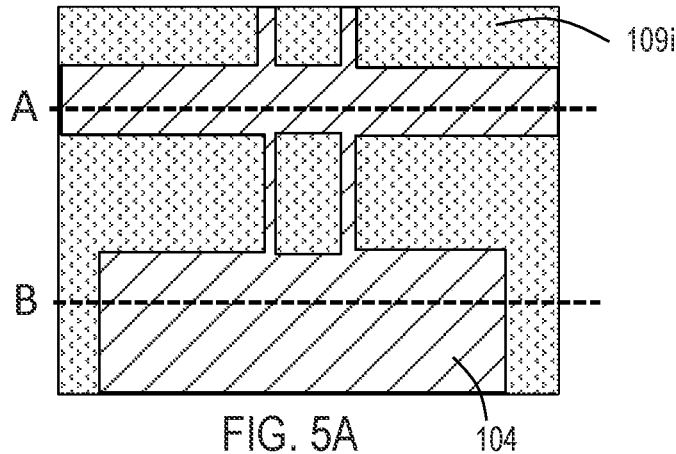
FIG. 5A illustrates a cross-sectional view of a memory device according to one or more embodiments of the disclosure.
Figure 5B:
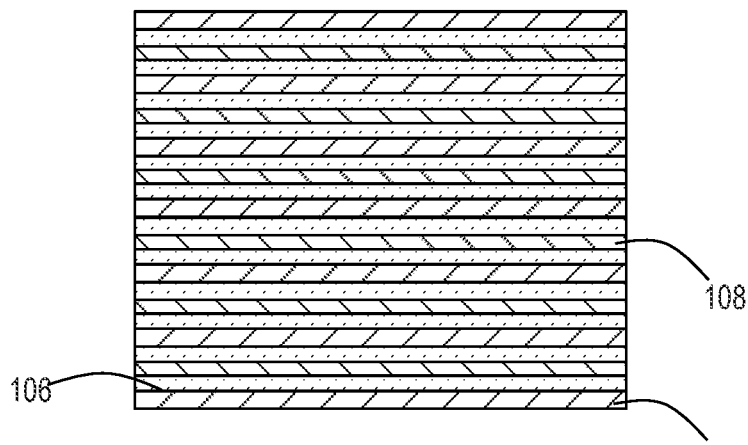
FIG. 5B illustrates a cross-sectional view of a memory device according to one or more embodiments of the disclosure.
Figure 5C:
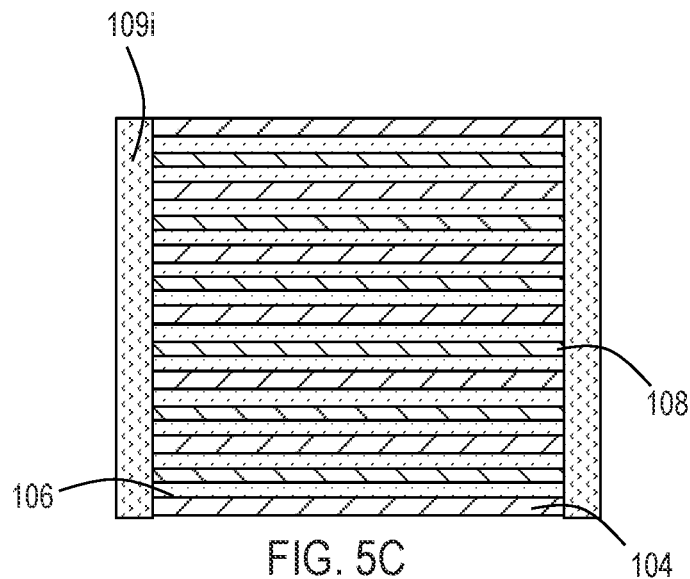
FIG. 5C illustrates a cross-sectional view of a memory device according to one or more embodiments of the disclosure.

Referring to FIGS. 5A to 5C, the isolation opening 109 is filled with an insulating material 109i. The insulating material 109i may be any suitable insulating material known to the skilled artisan. In one or more embodiments, the insulating material 109i is a dielectric material. As used herein, the term "dielectric material" refers to a layer of material that is an electrical insulator that can be polarized in an electric field. In one or more embodiments, the insulating material 109i comprises one or more of oxides, carbon doped oxides, silicon oxide (SiO), porous silicon dioxide ($SiO_2$), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the insulating material 109i comprises silicon oxide ($SiO_x$).

Figure 6A:
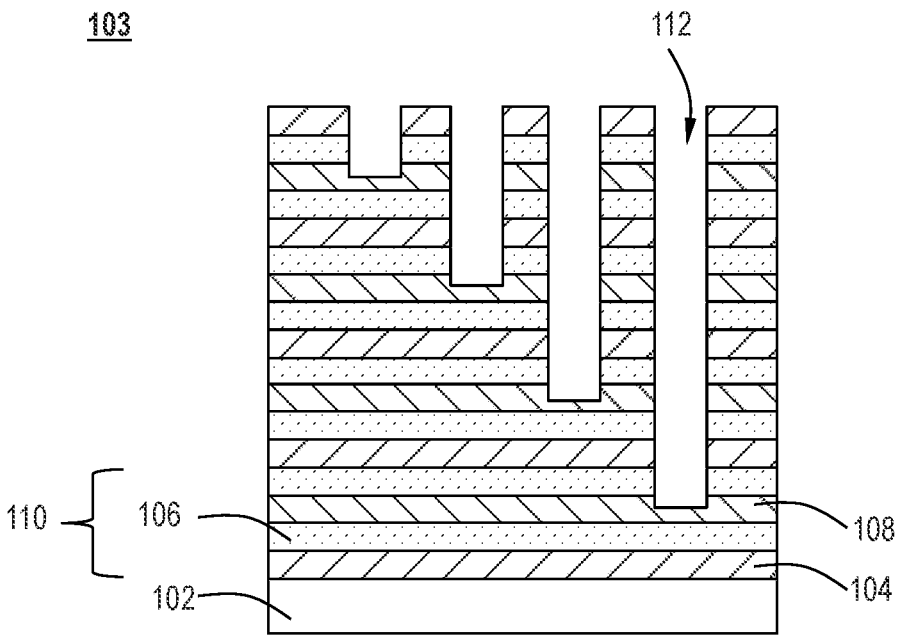
FIG. 6A illustrates a cross-sectional view of a memory device according to one or more embodiments of the disclosure.
Figure 6B:
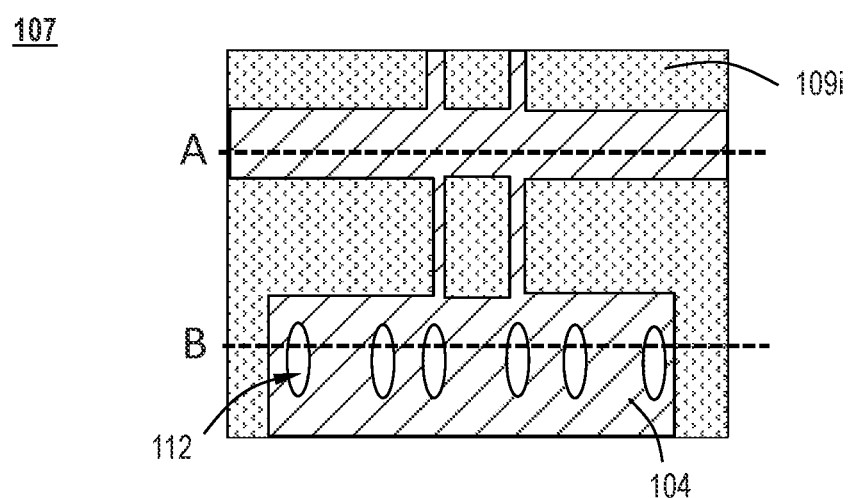
FIG. 6B illustrates a cross-sectional view of a memory device according to one or more embodiments of the disclosure.
Figure 6C:
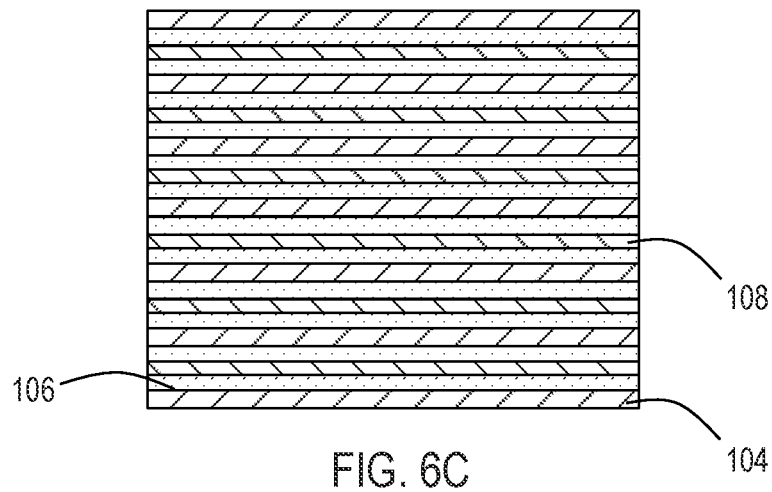
FIG. 6C illustrates a cross-sectional view of a memory device according to one or more embodiments of the disclosure.
Figure 6D:
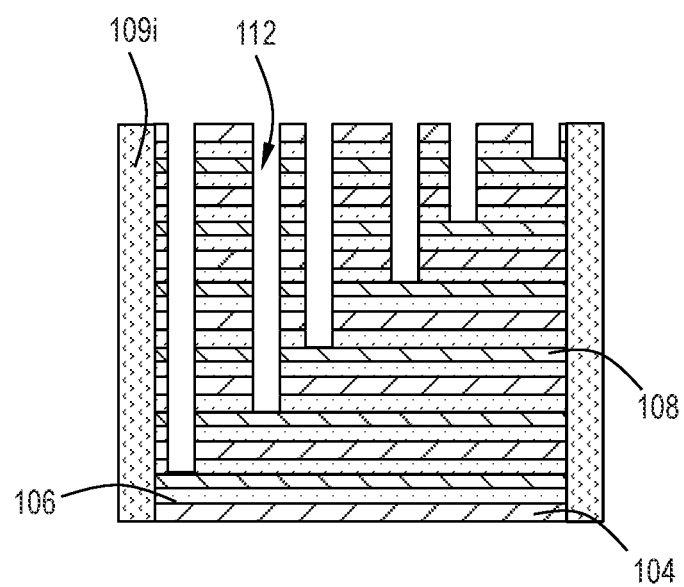
FIG. 6D illustrates a cross-sectional view of a memory device according to one or more embodiments of the disclosure.
Figure 7A:
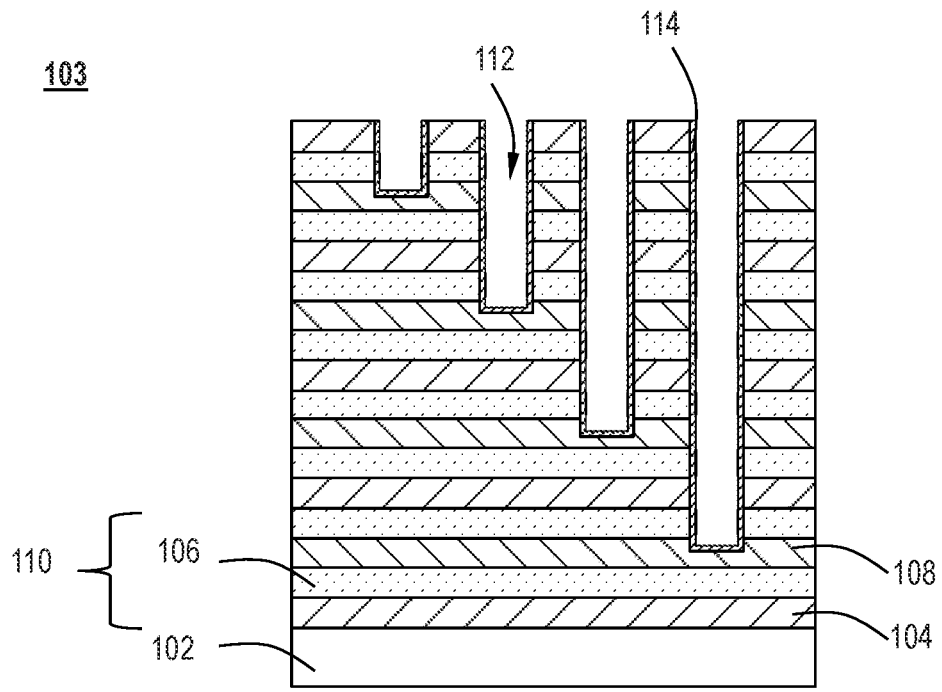
FIG. 7A illustrates a cross-sectional view of a memory device according to one or more embodiments of the disclosure.
Figure 7B:
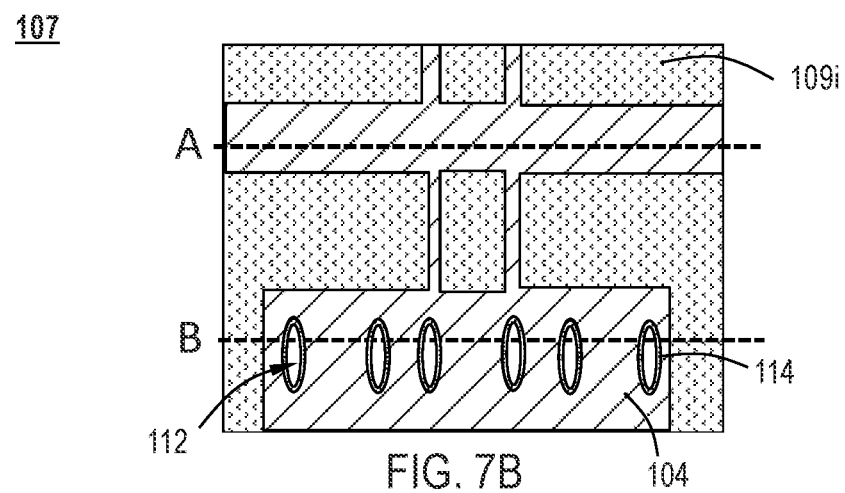
FIG. 7B illustrates a cross-sectional view of a memory device according to one or more embodiments of the disclosure.
Figure 7C:
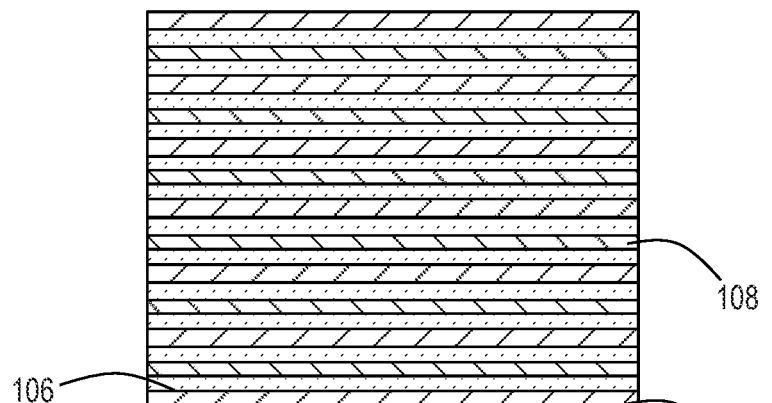
FIG. 7C illustrates a cross-sectional view of a memory device according to one or more embodiments of the disclosure.
Figure 7D:
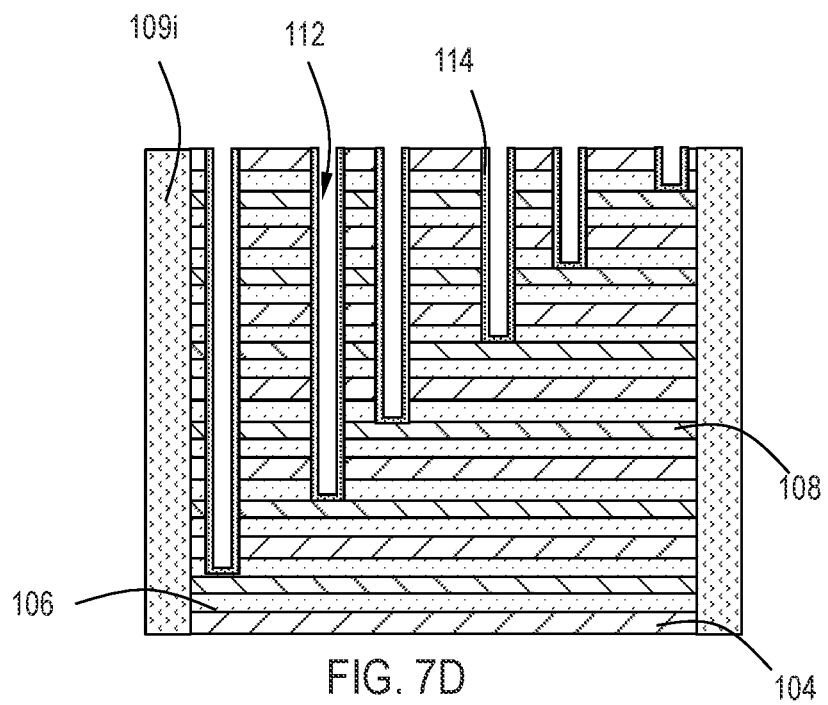
FIG. 7D illustrates a cross-sectional view of a memory device according to one or more embodiments of the disclosure.
Figure 8A:
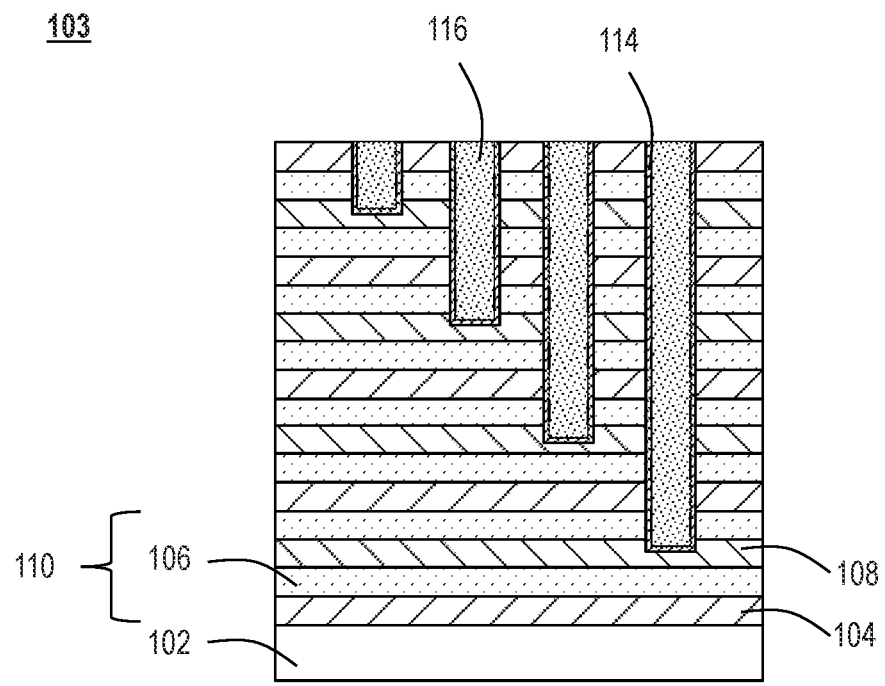
FIG. 8A illustrates a cross-sectional view of a memory device according to one or more embodiments of the disclosure.
Figure 8B:
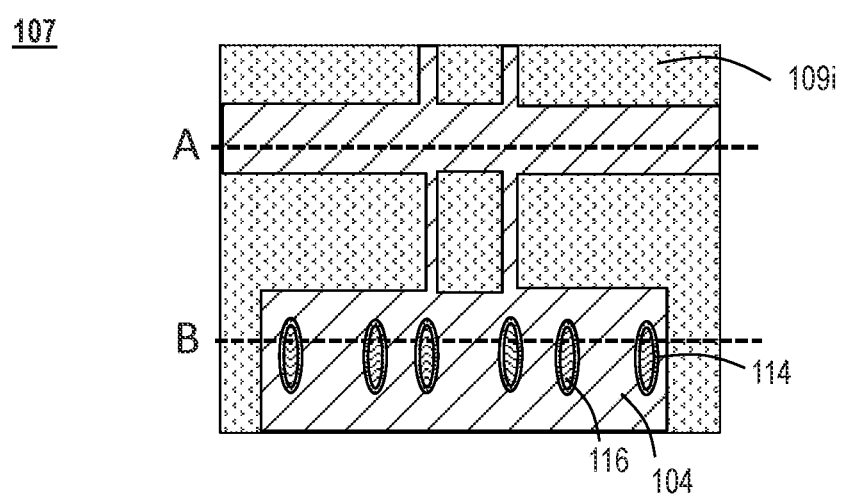
FIG. 8B illustrates a cross-sectional view of a memory device according to one or more embodiments of the disclosure.
Figure 8C:
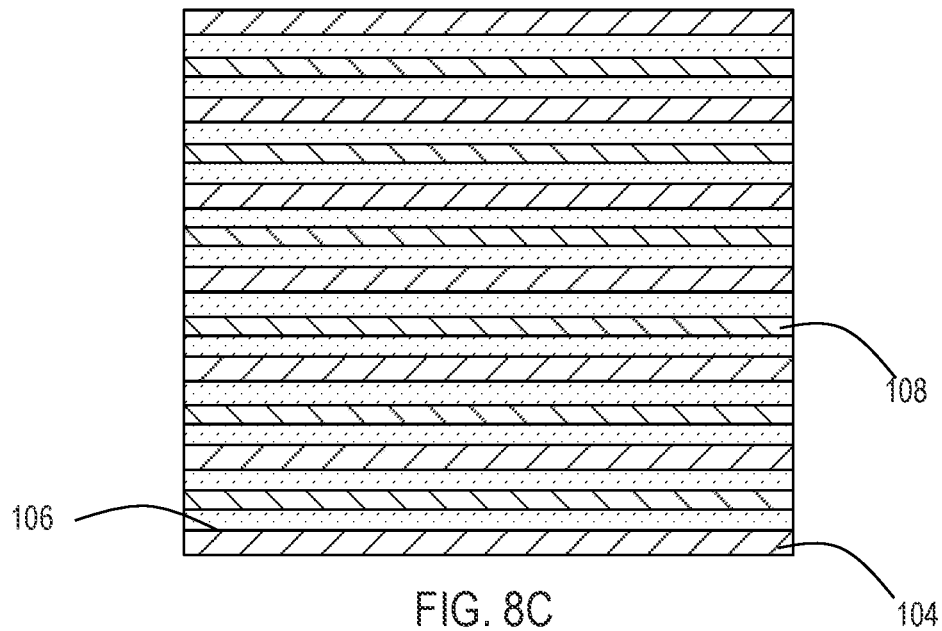
FIG. 8C illustrates a cross-sectional view of a memory device according to one or more embodiments of the disclosure.
Figure 8D:
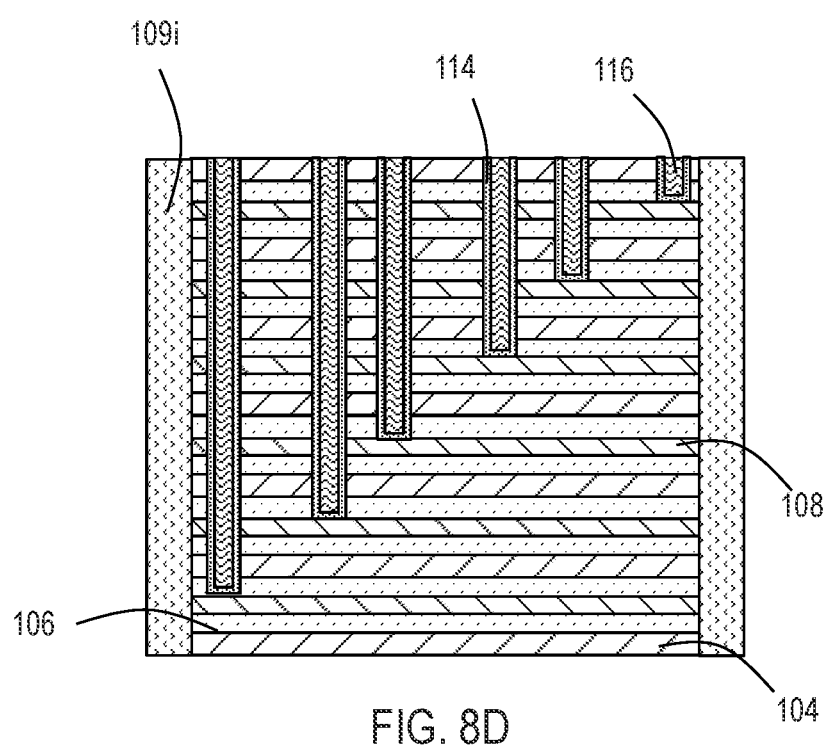
FIG. 8D illustrates a cross-sectional view of a memory device according to one or more embodiments of the disclosure.
Figure 9A:
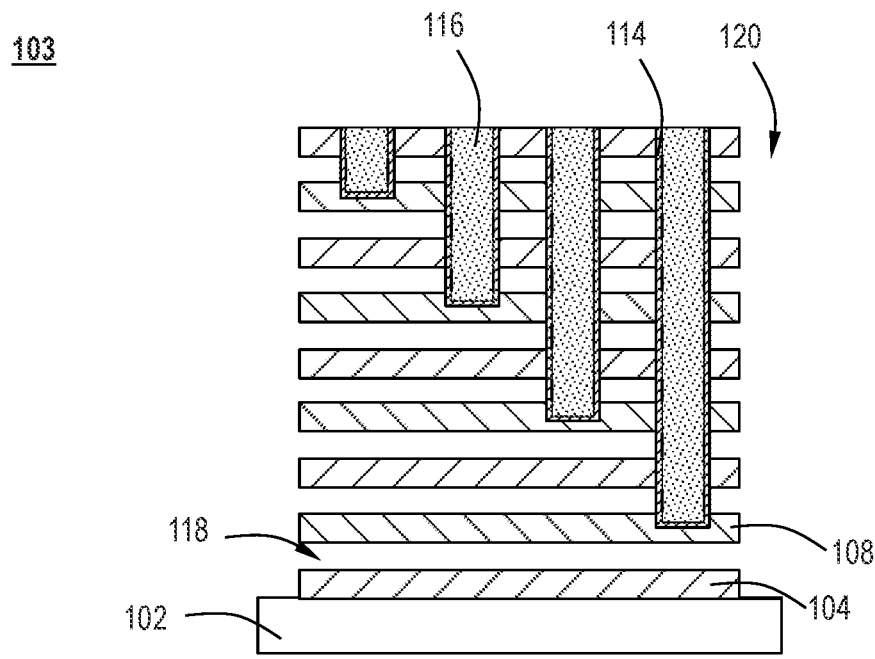
FIG. 9A illustrates a cross-sectional view of a memory device according to one or more embodiments of the disclosure.
Figure 9B:
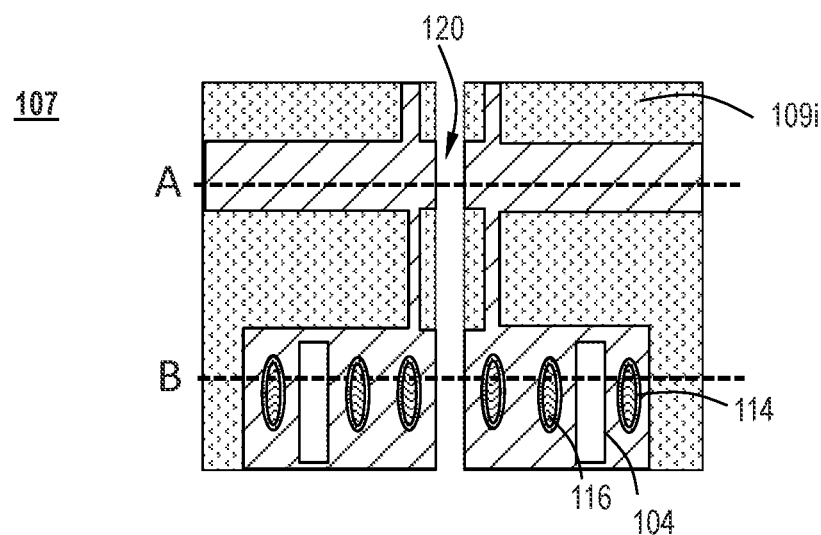
FIG. 9B illustrates a cross-sectional view of a memory device according to one or more embodiments of the disclosure.
Figure 9C:
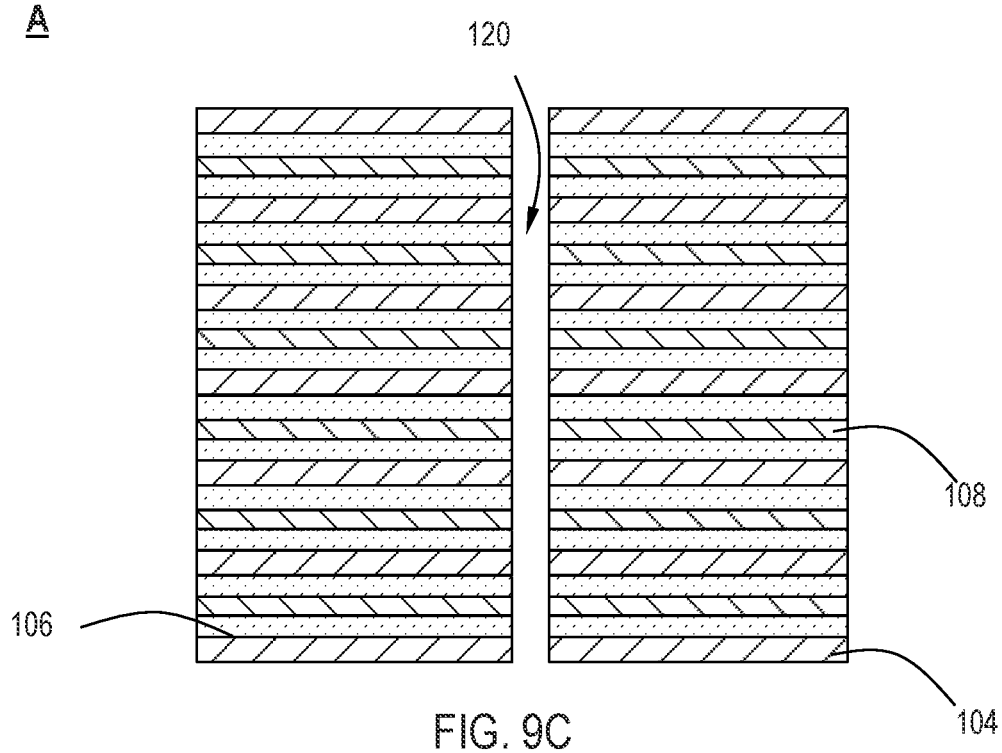
FIG. 9C illustrates a cross-sectional view of a memory device according to one or more embodiments of the disclosure.
Figure 9D:
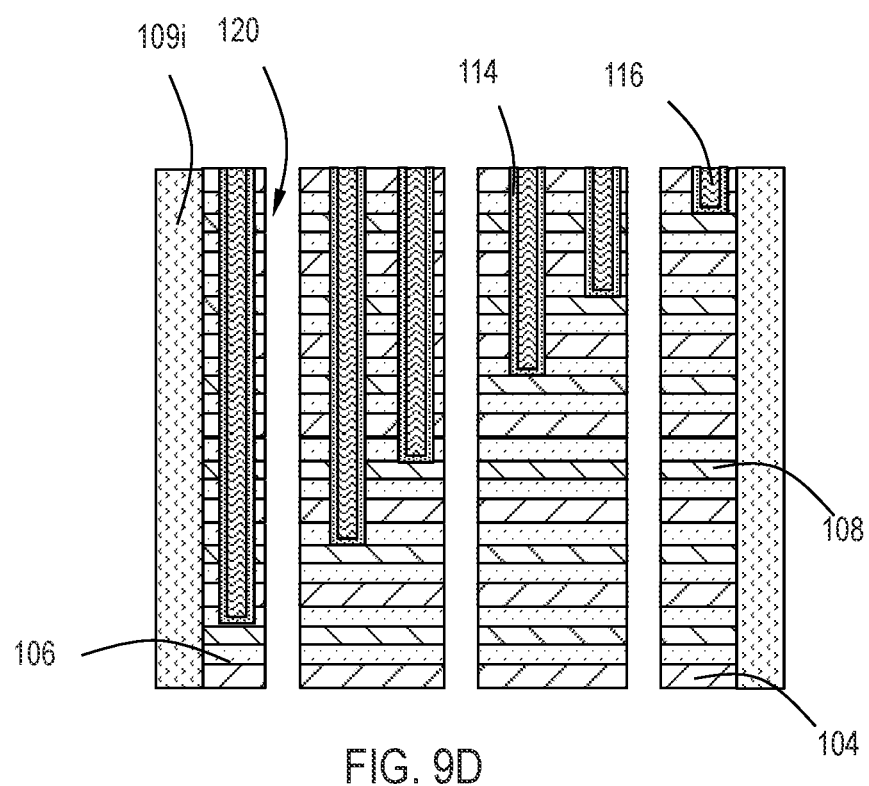
FIG. 9D illustrates a cross-sectional view of a memory device according to one or more embodiments of the disclosure.

Referring to FIGS. 6A to 6D, the device 103 is patterned to form an opening 112. In some embodiments, patterning the opening 112 comprises etching through the memory stack 111. In one or more embodiments, the semiconductor layer 108 serves as an etch stop. Referring to FIG. 6A, the opening 112 has sidewalls that extend through the memory stack 111 exposing surfaces of the sacrificial layers 106, the insulating layer 104, and the semiconductor layer 108.

In one or more embodiments, each of the openings 112 has a depth different from the depth of the opening 112 adjacent to it. In one or more embodiments, the opening 112 has a depth in a range of nLayer×tUnit range from 1.5 um to 50 um, where nLayer, number of stacks, is 50 layers to 500 layers, and tUnit (thickness of unit mold) is ranging from 30 nm to 100 nm.

The sacrificial layer 106, the semiconductor layer 108, and the insulating layer 104 have surfaces exposed as sidewalls of the opening 112. The bottom of the opening 112 can be formed at any point within the thickness of the semiconductor layer 108. In some embodiments, the opening 112 extends a thickness into the semiconductor layer in the range of from about 10% to about 90%, or in the range of from about 20% to about 80%, or in the range of from about 30% to about 70%, or in the range of from about 40% to about 60% of the thickness of the semiconductor layer 108. In some embodiments, the opening 112 extends a distance into the semiconductor layer 108 by greater than or equal to 10%, 20%, 30%, 40%, 50%, 60%, 70% or 80% of the thickness of the semiconductor layer 108.

Referring to FIGS. 7A to 7D, an insulating layer 114 is conformally deposited in each of the high aspect ratio plurality of openings 112. As used in this manner, a conformal film has a thickness near the top of the feature that is in the range of about 80-120% of the thickness at the bottom of the feature. The insulating layer 114 may be any suitable material known to the skilled artisan. In one or more embodiments, the insulating layer 114 (or liner) comprises one or more of silicon oxide ($SiO_x$) and silicon nitride (SiN). In some embodiments, the insulating layer 114 functions as an etch stop layer in later processing steps.

With reference to FIGS. 8A to 8D, a sacrificial layer 116 is deposited in the plurality of openings 112 adjacent to the insulating layer 114. The sacrificial layer 116 may be any suitable material known to the skilled artisan. In one or more embodiments, the sacrificial layer 116 comprises one or more of tungsten (W), silicon germanium (SiGe), germanium (Ge), carbon (C), titanium nitride (TiN), and the like. In subsequent processing, the sacrificial layer 116 will be replaced with a conductive material 134 after formation of a replacement gate. In one or more embodiments, the plurality of openings 112 are filled in a bottom-up gapfill process, filling the feature from the bottom. In other embodiments, the plurality of openings 112 are filled using a conformal process, where the feature is filled from the bottom and sides.

FIGS. 9A to 9D show operation 20 of method 10, where the device is slit patterned to form slit pattern openings 120 that extend from a top surface of the memory stack 111 to the substrate 102.

Figure 10A:
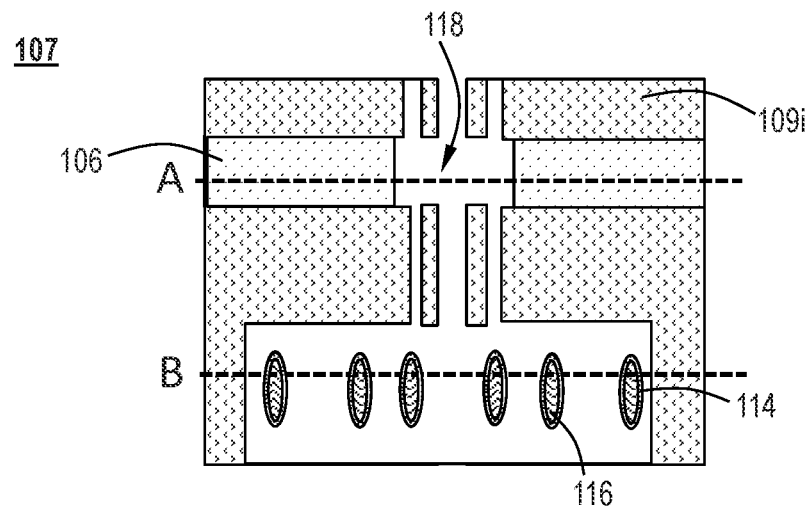
FIG. 10A illustrates a cross-sectional view of a memory device according to one or more embodiments of the disclosure.
Figure 10B:
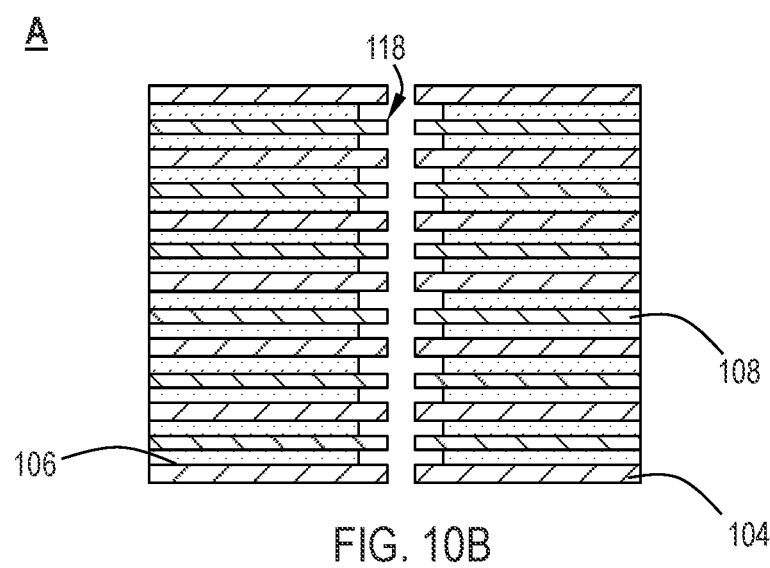
FIG. 10B illustrates a cross-sectional view of a memory device according to one or more embodiments of the disclosure.
Figure 10C:
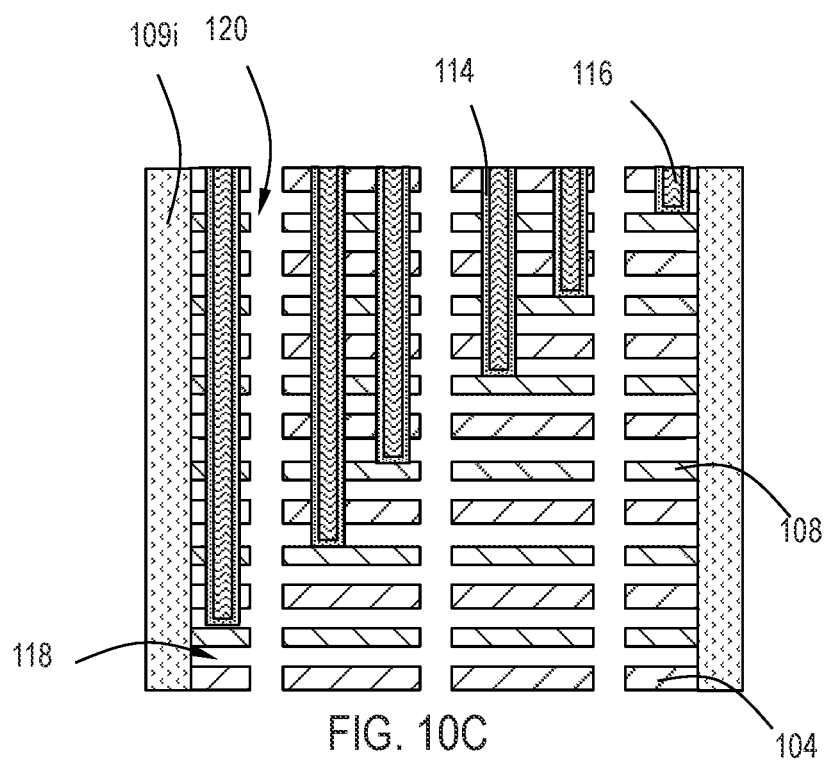
FIG. 10C illustrates a cross-sectional view of a memory device according to one or more embodiments of the disclosure.
Figure 11A:
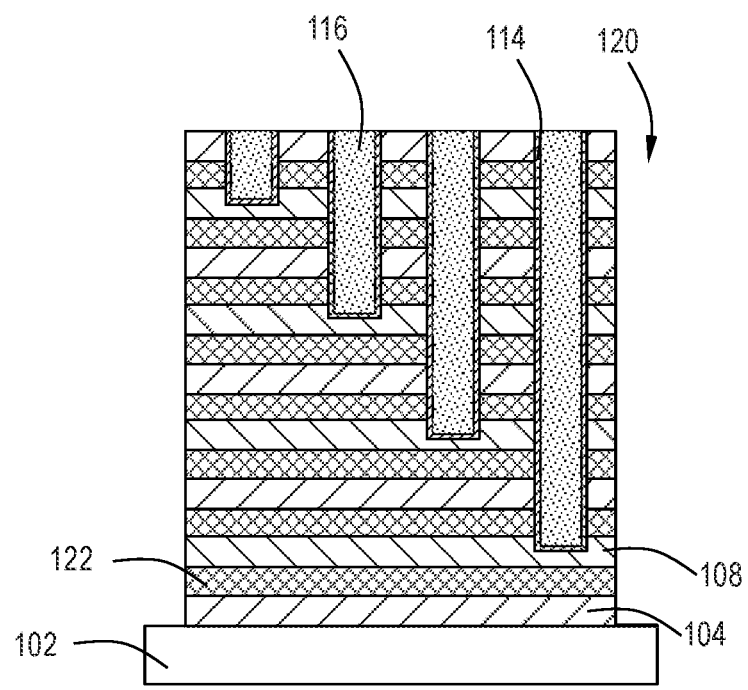
FIG. 11A illustrates a cross-sectional view of a memory device according to one or more embodiments of the disclosure.
Figure 11B:
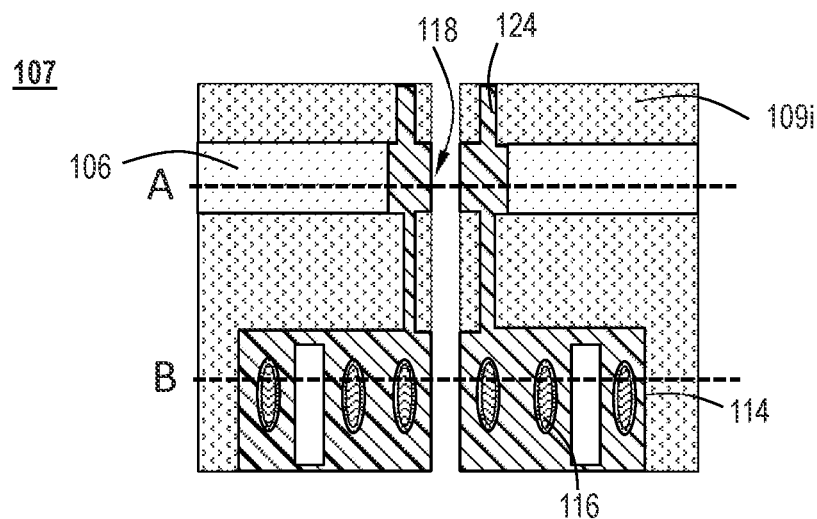
FIG. 11B illustrates a cross-sectional view of a memory device according to one or more embodiments of the disclosure.
Figure 11C:
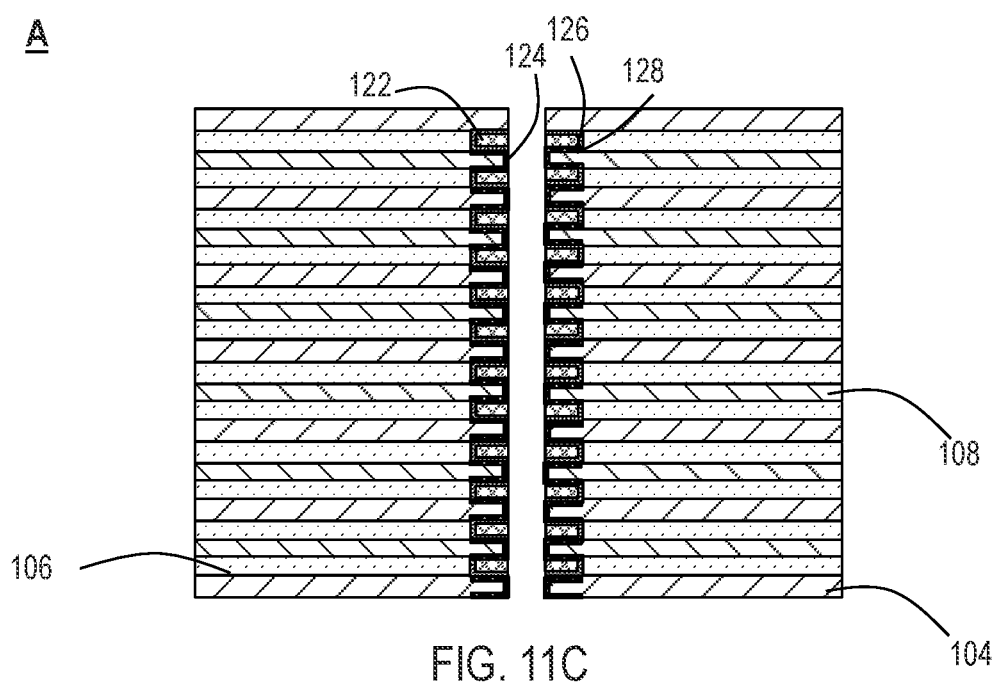
FIG. 11C illustrates a cross-sectional view of a memory device according to one or more embodiments of the disclosure.
Figure 11D:
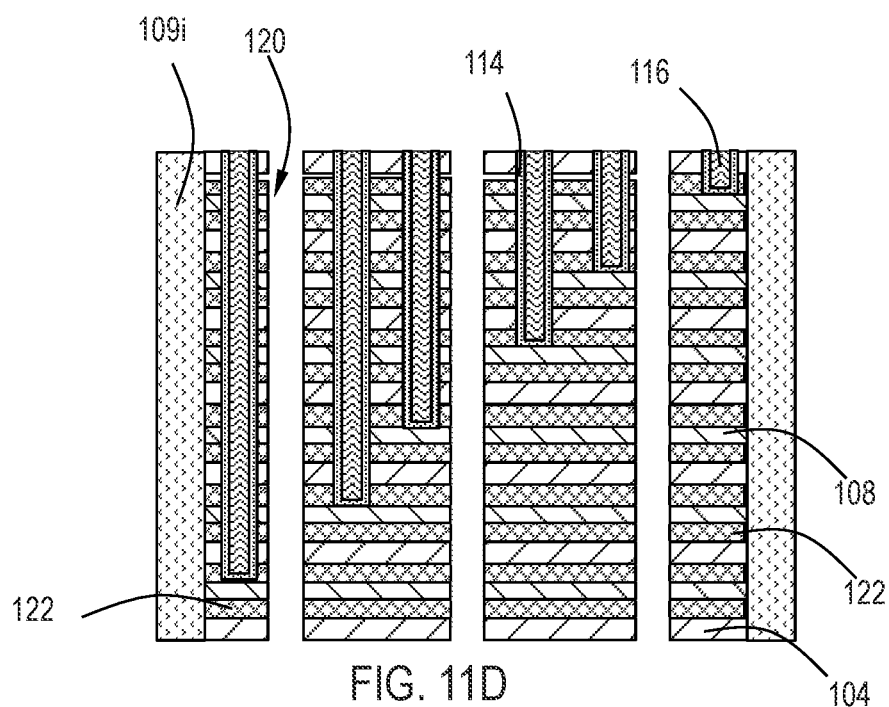
FIG. 11D illustrates a cross-sectional view of a memory device according to one or more embodiments of the disclosure.
Figure 12A:
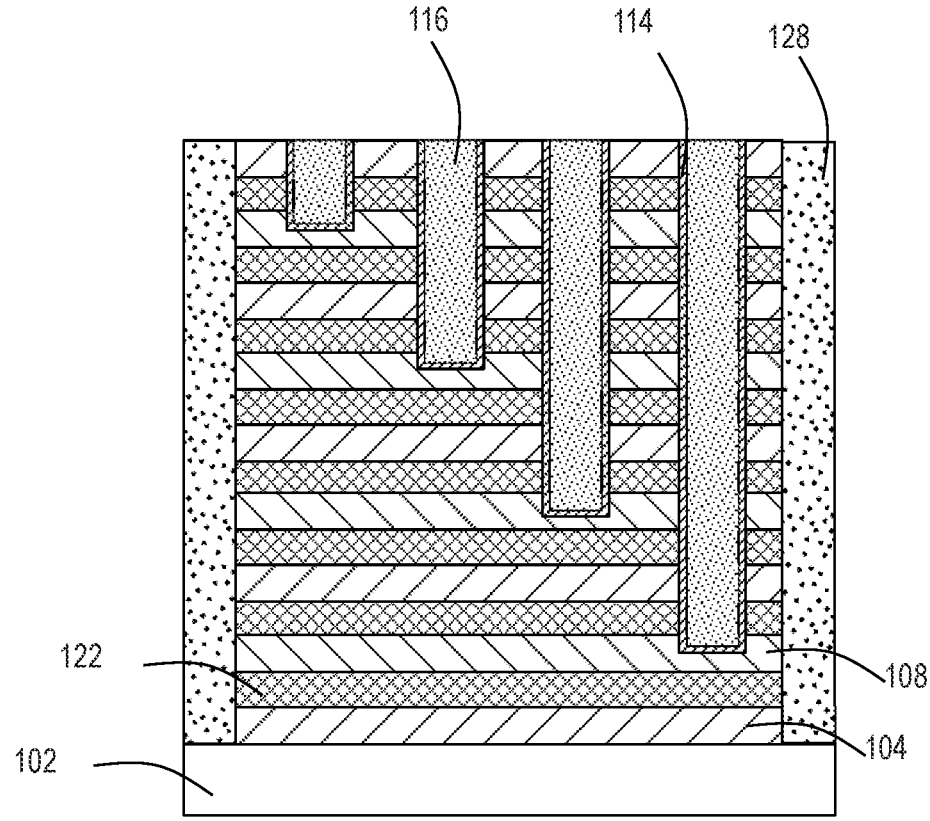
FIG. 12A illustrates a cross-sectional view of a memory device according to one or more embodiments of the disclosure.
Figure 12B:
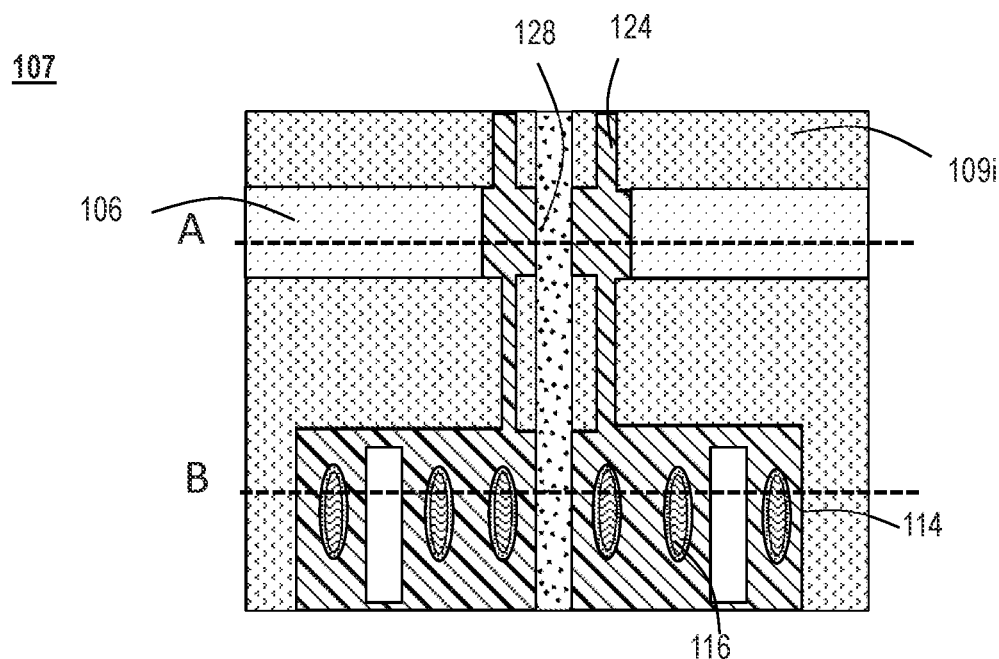
FIG. 12B illustrates a cross-sectional view of a memory device according to one or more embodiments of the disclosure.
Figure 12C:
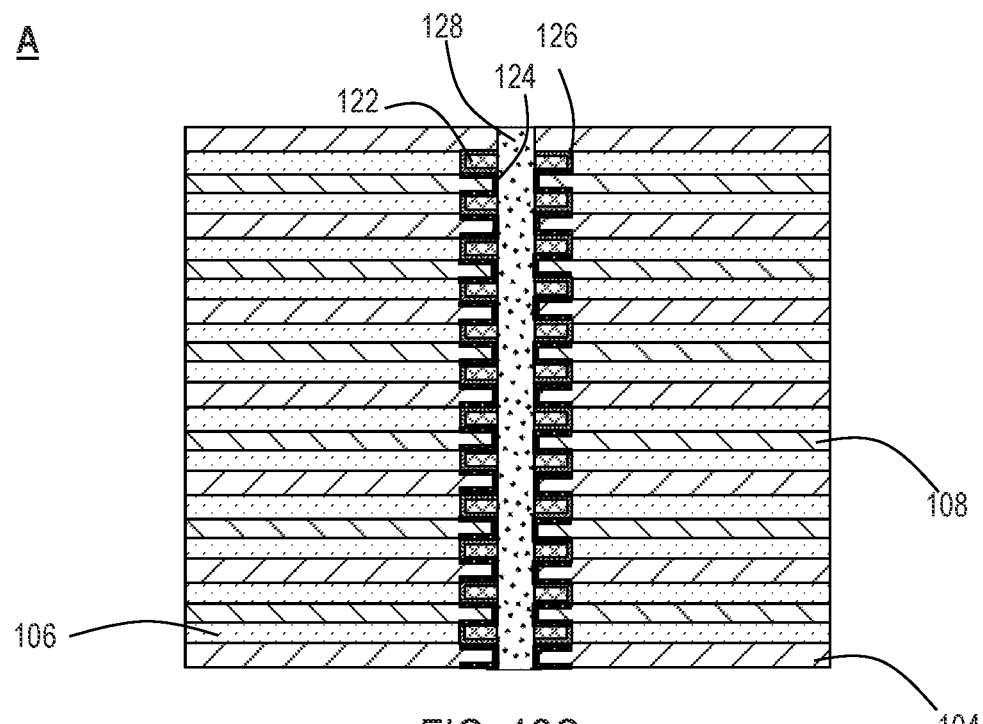
FIG. 12C illustrates a cross-sectional view of a memory device according to one or more embodiments of the disclosure.
Figure 12D:
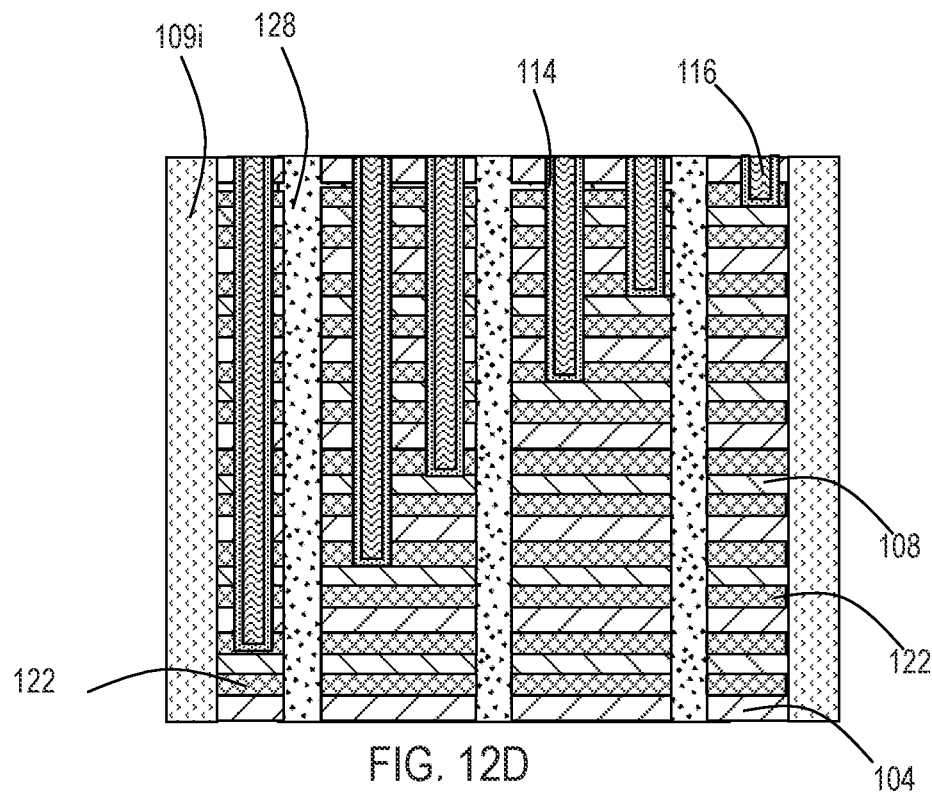
FIG. 12D illustrates a cross-sectional view of a memory device according to one or more embodiments of the disclosure.

With reference to FIGS. 10A to 10C, the sacrificial layer 106 (i.e., silicon nitride (SiN)) are selectively removed through slit patterning opening 120 to form an opening region 118. In one or more embodiments, the sacrificial layer 106, e.g., nitride layers, are removed through the slit pattern opening 120 using hot phosphorus (HP).

Referring to FIGS. 11A to 11D, a gate oxide layer 124 is deposited through the opening 120 onto the insulating layer 104. The gate oxide layer 124 may comprise any suitable material known to the skilled artisan. The gate oxide layer 124 can be deposited using one or more deposition techniques known to the skilled artisan. In one or more embodiments, the gate oxide layer 124 is deposited using one of deposition techniques, such as, but not limited to, ALD, CVD, PVD, MBE, MOCVD, spin-on, or other deposition techniques known to the skilled artisan. The illustrated embodiment shows the gate oxide layer 124 as a conformal layer with a uniform shape. However, the skilled artisan will recognize that this is merely for illustrative purposes and that the gate oxide layer 124 can form in an isotropic manner so that the gate oxide layer 124 has a rounded appearance. In some embodiments, the gate oxide layer 124 is selectively deposited as a conformal layer on the surface of the insulating layer 104. In some embodiments, the gate oxide layer 124 is formed by oxidation of the semiconductor surface.

In one or more embodiments, the gate oxide layer 124 comprises a silicon oxide ($SiO_x$). While the term "silicon oxide" may be used to describe the gate oxide layer 124, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, tungsten oxide, zirconium oxide, aluminum oxide, hafnium oxide, and the like.

In one or more embodiments, word line is then formed in the opening 118. The word lines comprise one or more of a barrier layer 126 and a word line metal 122. The barrier layer 126 may comprise any suitable barrier layer known to the skilled artisan. In one or more embodiments, the barrier layer 126 comprises one or more of titanium nitride (TiN), tantalum nitride (TaN), or the like. In one or more embodiments, the word line metal 122 comprises a bulk metal comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the word line metal 122 comprises tungsten (W). In other embodiments, the word line metal 122 comprises ruthenium (Ru).

Referring to FIGS. 12A to 12D, the slit pattern opening 120 is filled with an insulating material 128. The insulating material 128 may comprise any suitable material known to the skilled artisan. In one or more embodiments, the insulating material 128 comprises silicon oxide ($SiO_x$). In one or more embodiments, the insulating material 128 is a sacrificial material that is removed in subsequent processing.

Figure 13A:
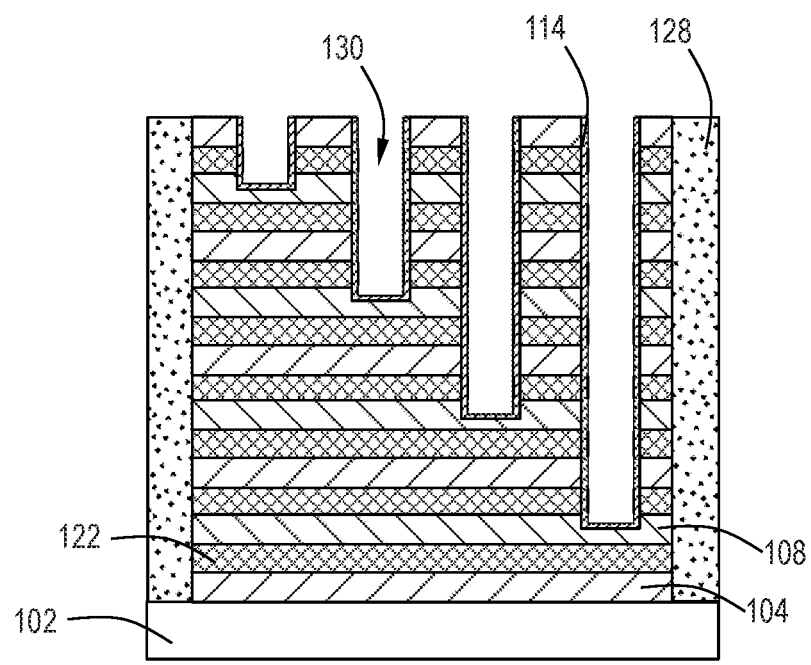
FIG. 13A illustrates a cross-sectional view of a memory device according to one or more embodiments of the disclosure.
Figure 13B:
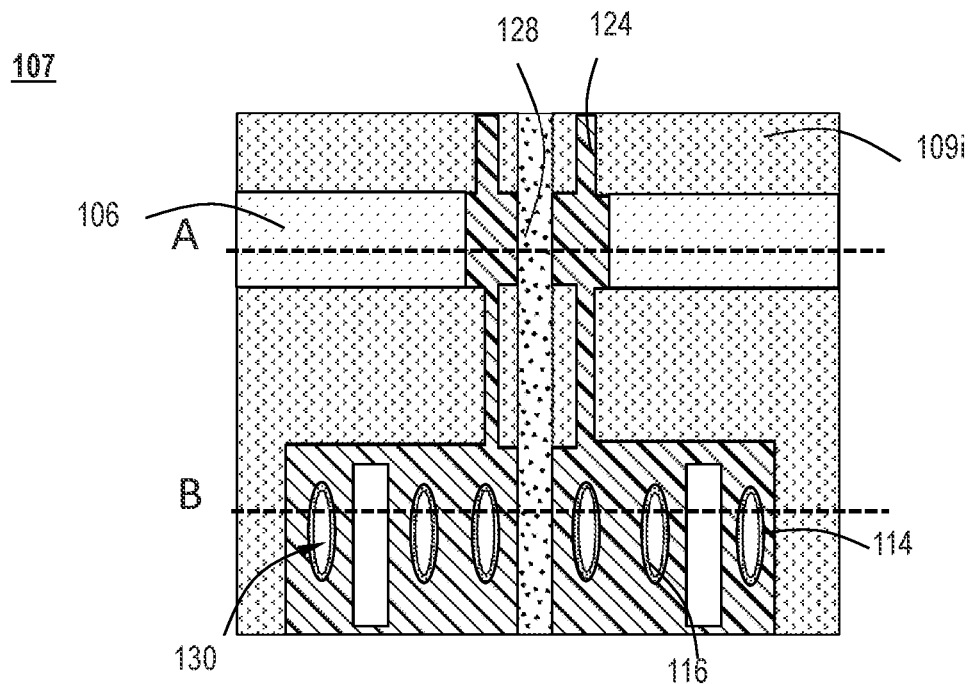
FIG. 13B illustrates a cross-sectional view of a memory device according to one or more embodiments of the disclosure.
Figure 13C:
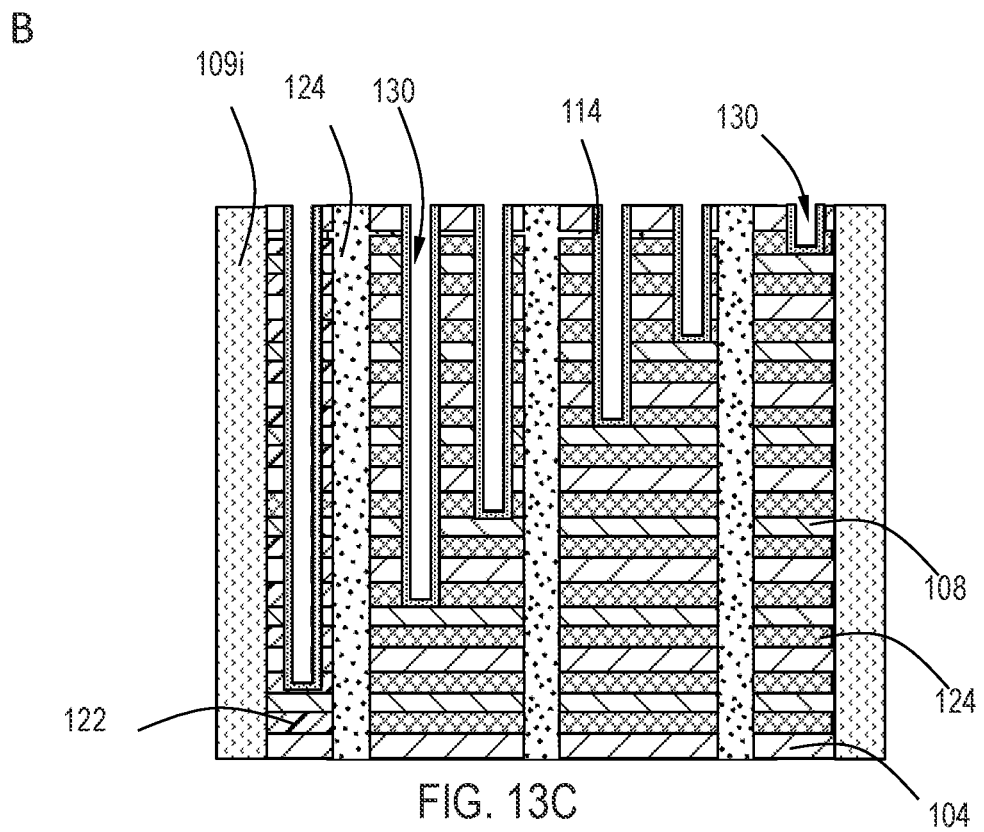
FIG. 13C illustrates a cross-sectional view of a memory device according to one or more embodiments of the disclosure.

With reference to FIGS. 13A to 13C, the sacrificial layer 116 is removed to form a plurality of contact openings 130. The sacrificial layer 116 may be removed by any suitable technique known to the skilled artisan. In one or more embodiments, the sacrificial layer 116 is removed by one or more of wet etching or dry etching. Each of the plurality of contact openings 130 has a depth different than the depth of the contact opening adjacent to it. Each contact opening 130 extends from the top surface of the device 103 to a semiconductor layer 108. In one or more embodiments, the critical dimension (CD) of each of the contact openings 130 is in a range of from 100 nm to 2000 nm.

Figure 14A:
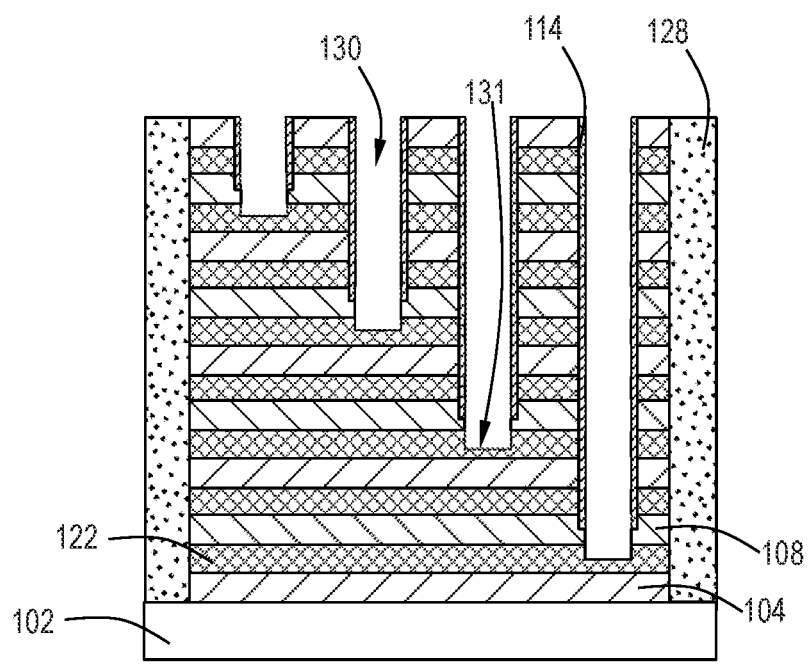
FIG. 14A illustrates a cross-sectional view of a memory device according to one or more embodiments of the disclosure.
Figure 14B:
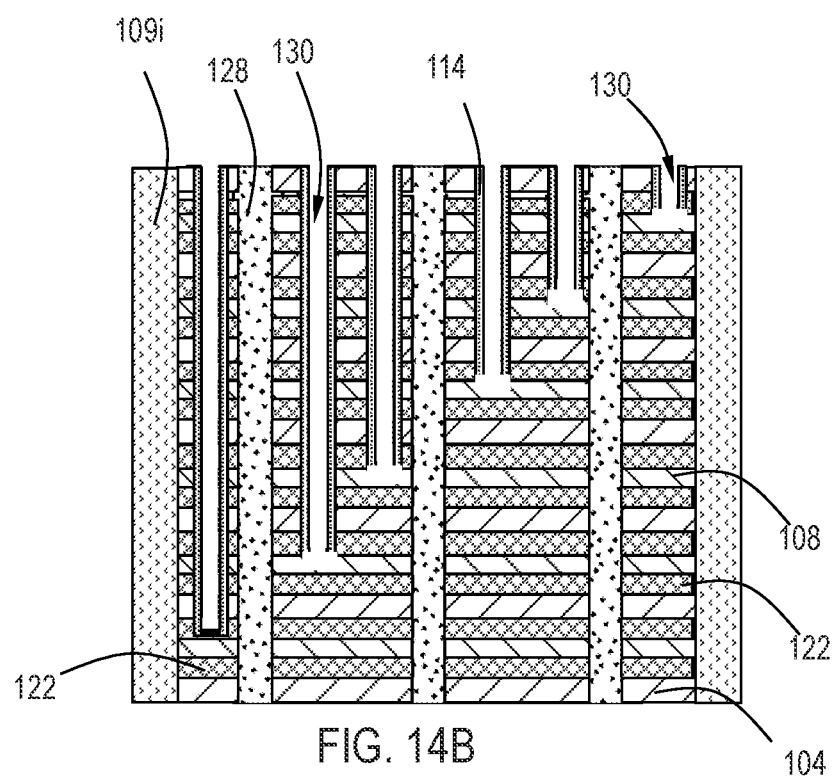
FIG. 14B illustrates a cross-sectional view of a memory device according to one or more embodiments of the disclosure.
Figure 15:
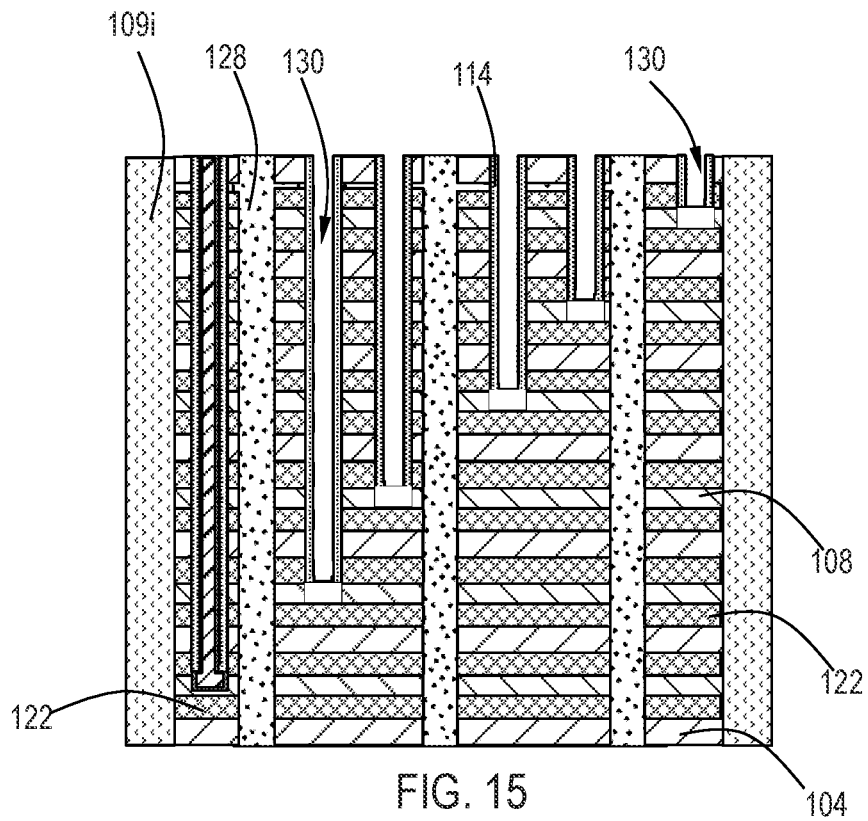
FIG. 15 illustrates a cross-sectional view of a memory device according to one or more embodiments of the disclosure.

Referring to FIGS. 14A and 14B, a portion of the insulating layer 114 at the bottom of each of the plurality of contact openings 130 is removed to form a portion 131 of the contact opening 130 that is free of insulating layer 114. Referring to FIG. 15, in one or more embodiments, the semiconductor layer 108, the gate oxide layer 124, and the conductive layer 122 which are adjourning the bottom of the plurality of contact openings 130 are enlarged using a selective removal process (SRP).

Figure 16A:
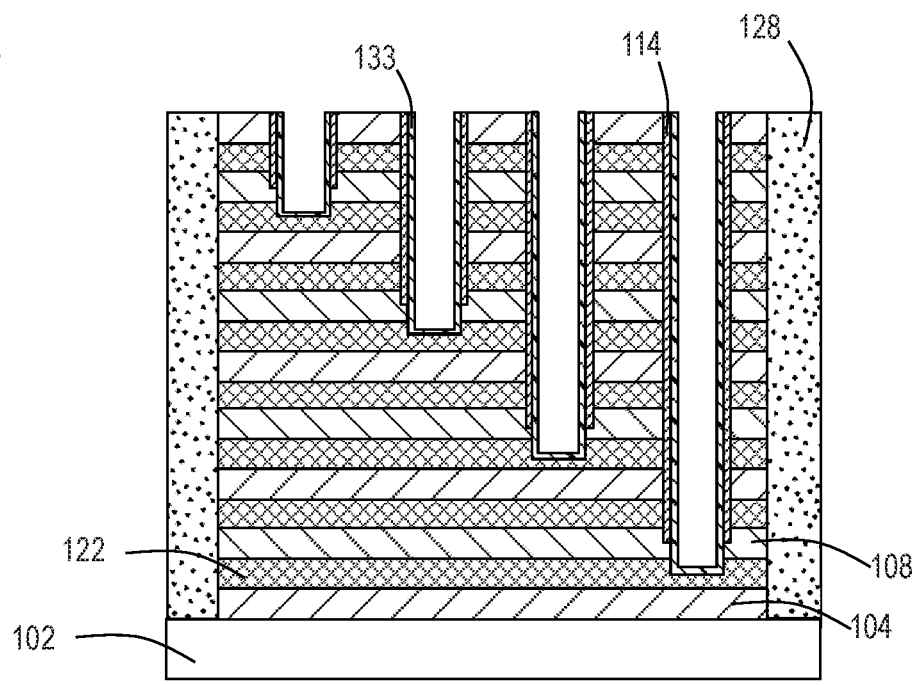
FIG. 16A illustrates a cross-sectional view of a memory device according to one or more embodiments of the disclosure.
Figure 16B:
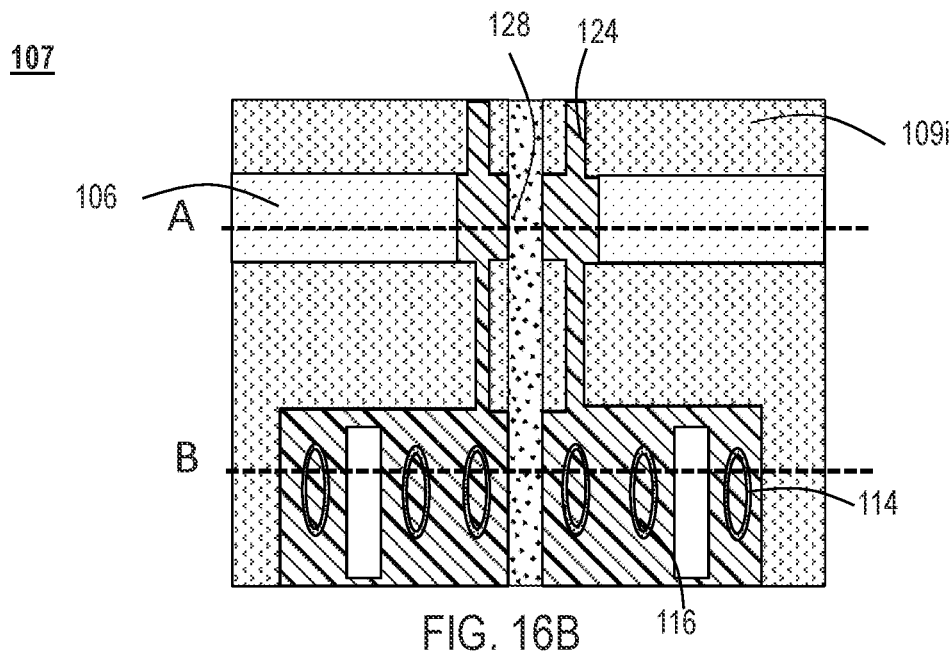
FIG. 16B illustrates a cross-sectional view of a memory device according to one or more embodiments of the disclosure.
Figure 16C:
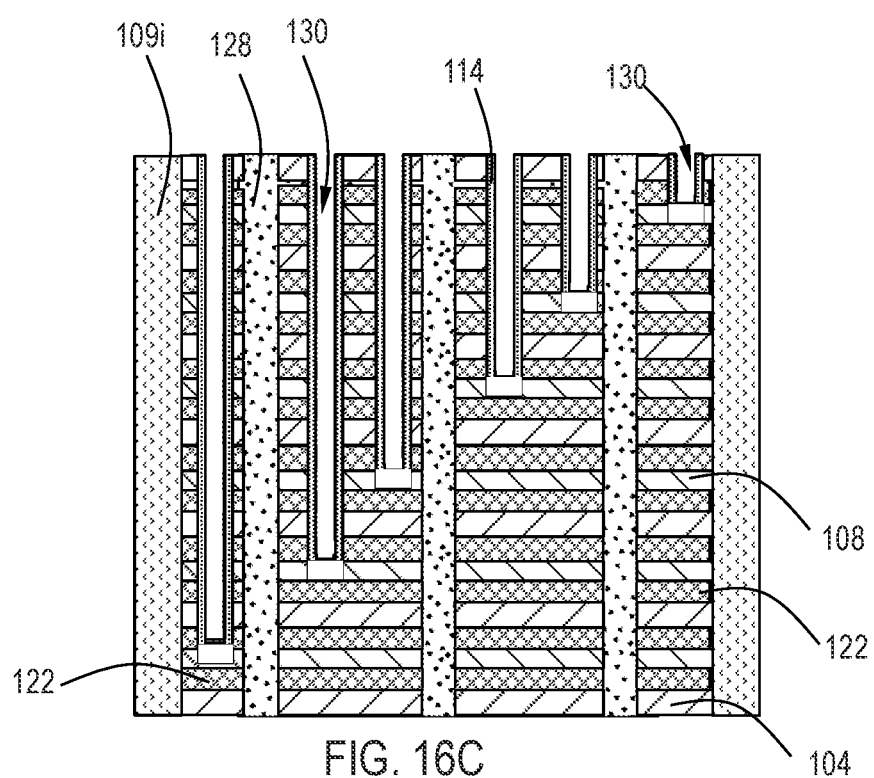
FIG. 16C illustrates a cross-sectional view of a memory device according to one or more embodiments of the disclosure.

With reference to FIGS. 16A to 16C, a barrier layer 133 is conformally deposited in each of the plurality of contact openings 130. The barrier layer 133 may comprise any suitable material known to the skilled artisan. In one or more embodiments, the barrier layer 133 comprises titanium nitride (TiN).

Figure 17:
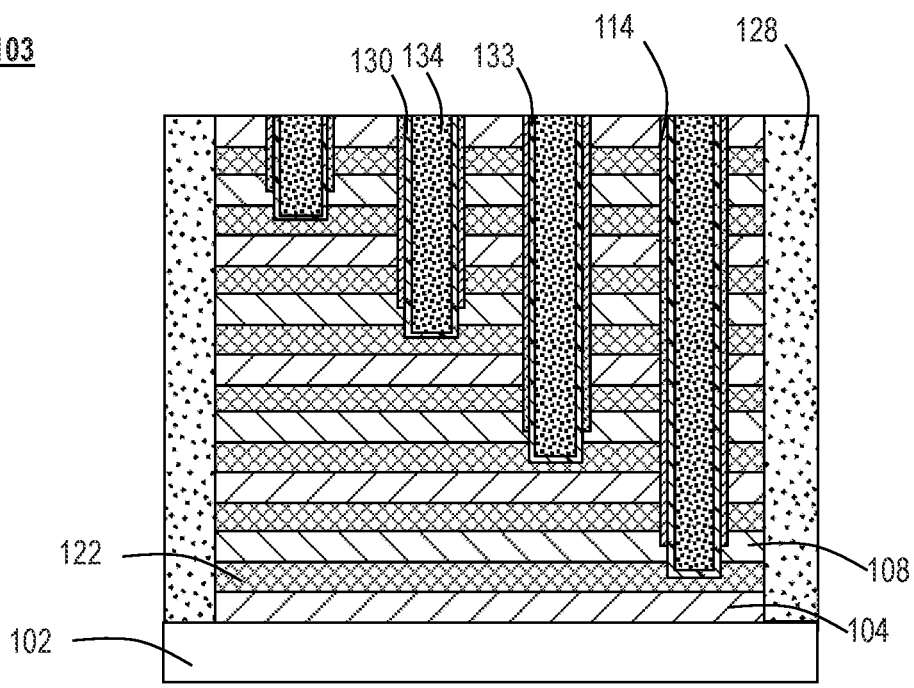
FIG. 17 illustrates a cross-sectional view of a memory device according to one or more embodiments of the disclosure.

Referring to FIG. 17, a conductive layer 134 is deposited in the plurality of contact openings 130 to form a contact. In one or more embodiments, the plurality of contact openings 130 are filled in a bottom-up gapfill process, filling the feature from the bottom. In other embodiments, the plurality of contact openings 130 are filled using a conformal process, where the feature is filled from the bottom and sides. The conductive layer 134 may comprise any suitable material known to the skilled artisan. In one or more embodiments, the conductive layer 134 comprises tungsten (W).

Figure 18A:
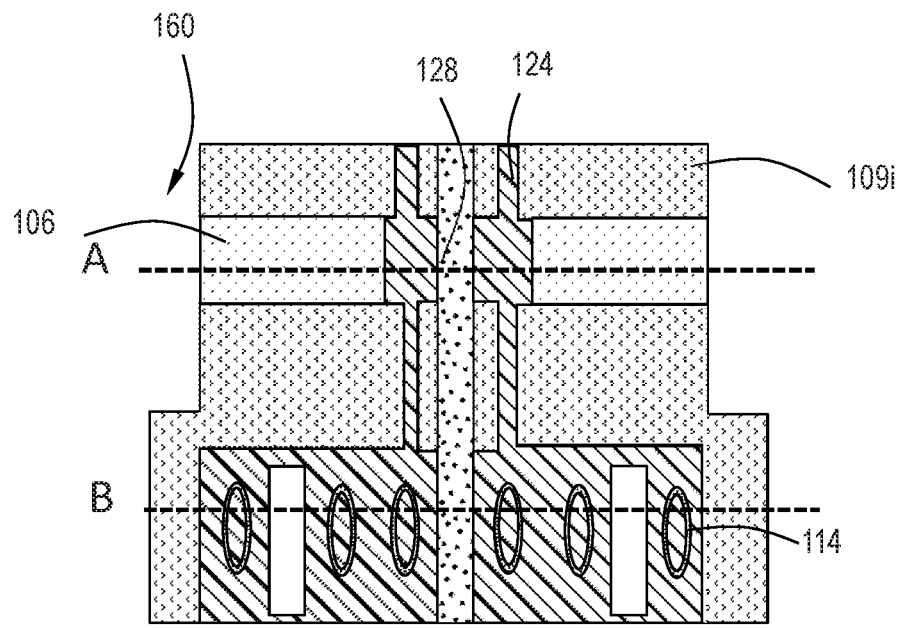
FIG. 18A illustrates a cross-sectional view of a memory device according to one or more embodiments of the disclosure.
Figure 18B:
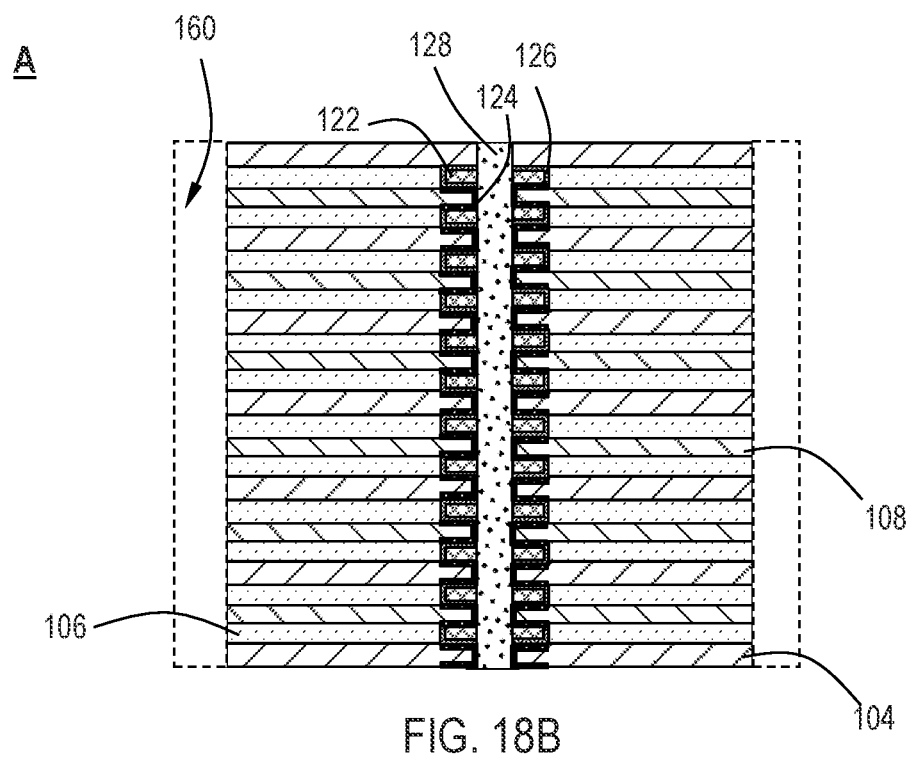
FIG. 18B illustrates a cross-sectional view of a memory device according to one or more embodiments of the disclosure.

With reference to FIGS. 18A and 18B, the insulating material 109i is removed to form an opening 160. The insulating material 109i may be removed by any suitable means known to the skilled artisan.

Figure 19A:
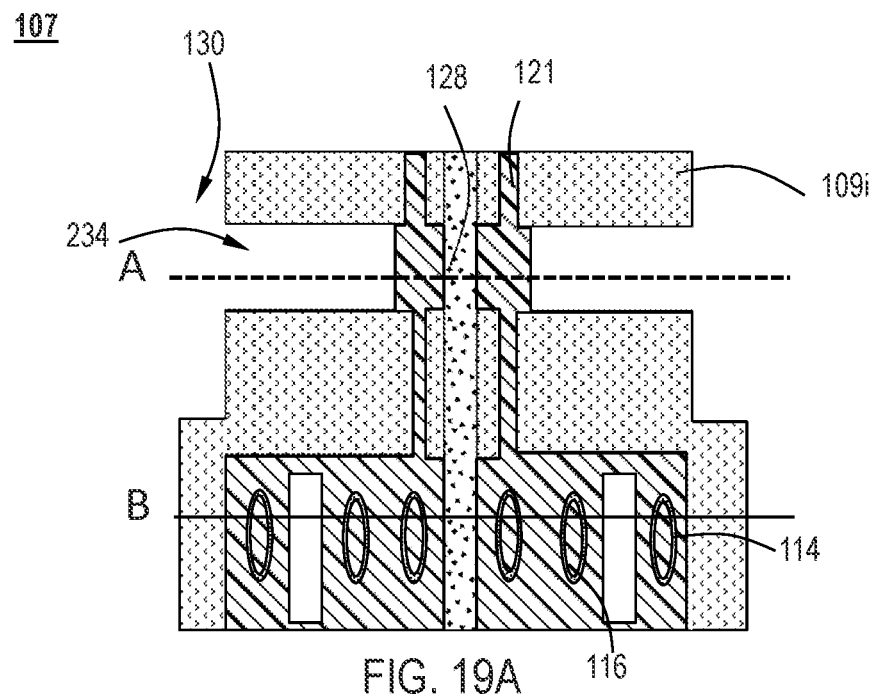
FIG. 19A illustrates a cross-sectional view of a memory device according to one or more embodiments of the disclosure.
Figure 19B:
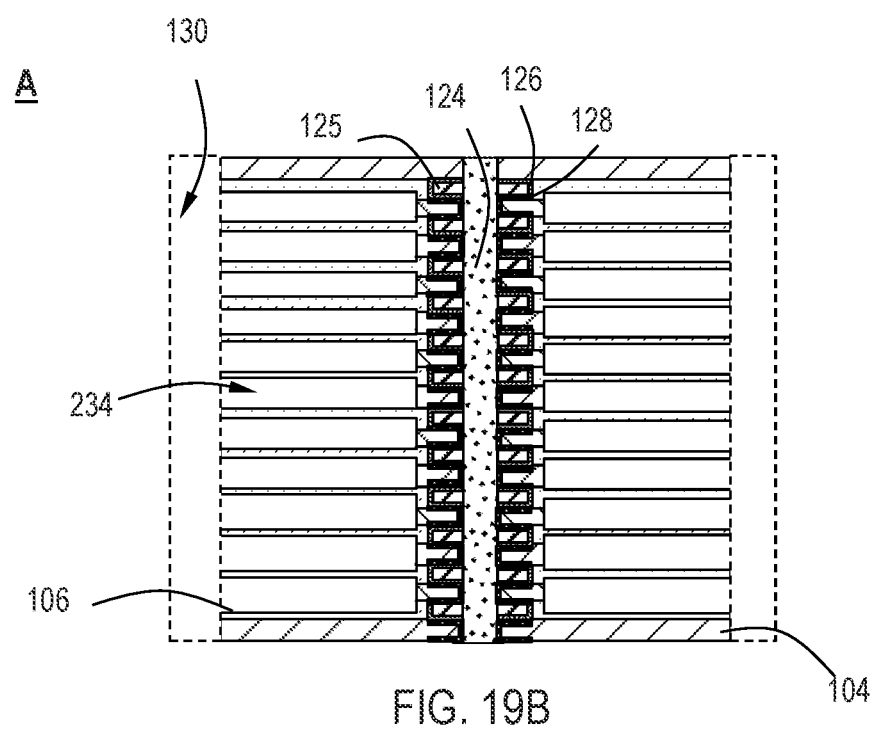
FIG. 19B illustrates a cross-sectional view of a memory device according to one or more embodiments of the disclosure.

Referring to FIGS. 19A to 19B, the semiconductor layer 108 is removed and the sacrificial layer 106 is trimmed to form an opening 234. The opening 234 may be enlarged or trimmed to create a widened opening 234. The opening 234 can be widened by any suitable technique known to the skilled artisan. The opening 234 of some embodiments is widened by a percentage of a thickness of the semiconductor layer 108. In some embodiments, the opening 234 is widened by an amount in the range of 10% to 80% of the thickness of the semiconductor layer 108. In some embodiments, the opening 234 is widened by an amount in the range of 20% to 75%, or in the range of 30% to 60%. In some embodiments, the opening 234 is widened using a dilute HF (~1% HF in water) wet etch.

Figure 20A:
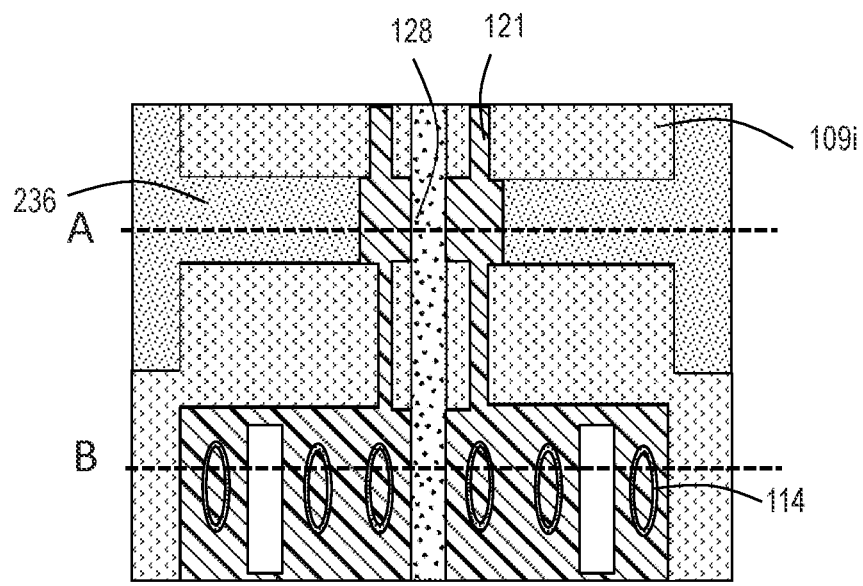
FIG. 20A illustrates a cross-sectional view of a memory device according to one or more embodiments of the disclosure.
Figure 20B:
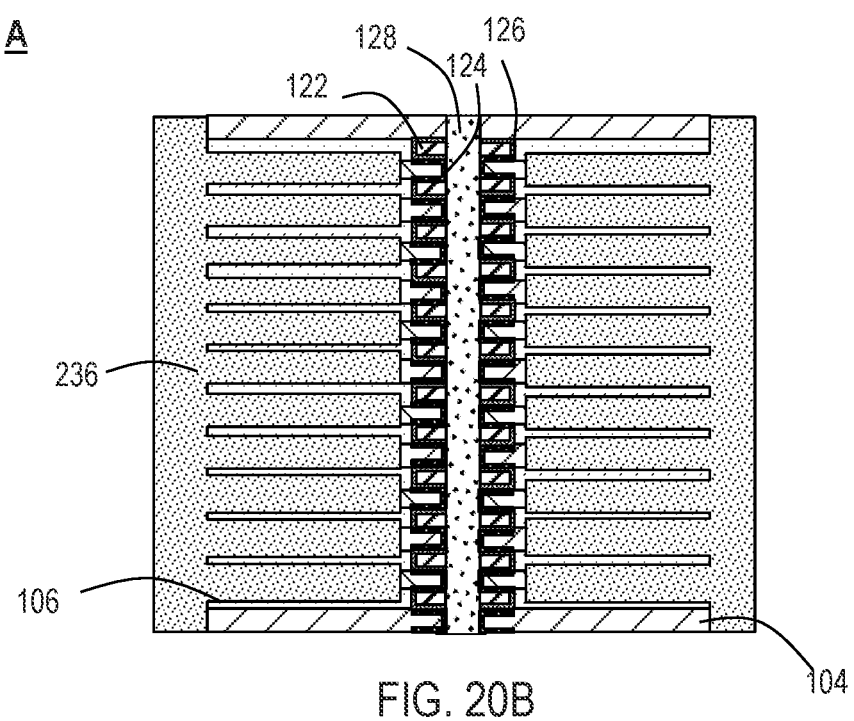
FIG. 20B illustrates a cross-sectional view of a memory device according to one or more embodiments of the disclosure.

Referring to FIGS. 20A to 20B, in one or more embodiments, the liner at bottom of contact is removed.

Figure 21A:
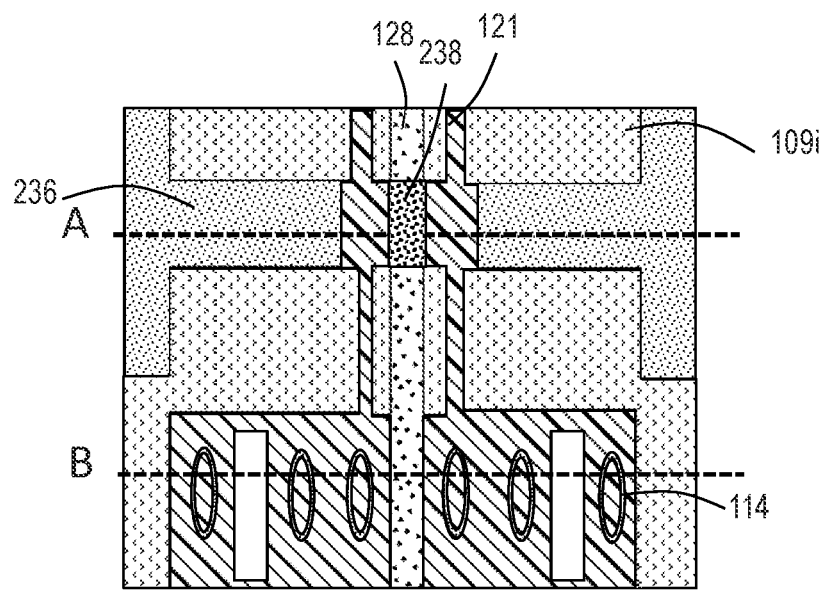
FIG. 21A illustrates a cross-sectional view of a memory device according to one or more embodiments of the disclosure.
Figure 21B:
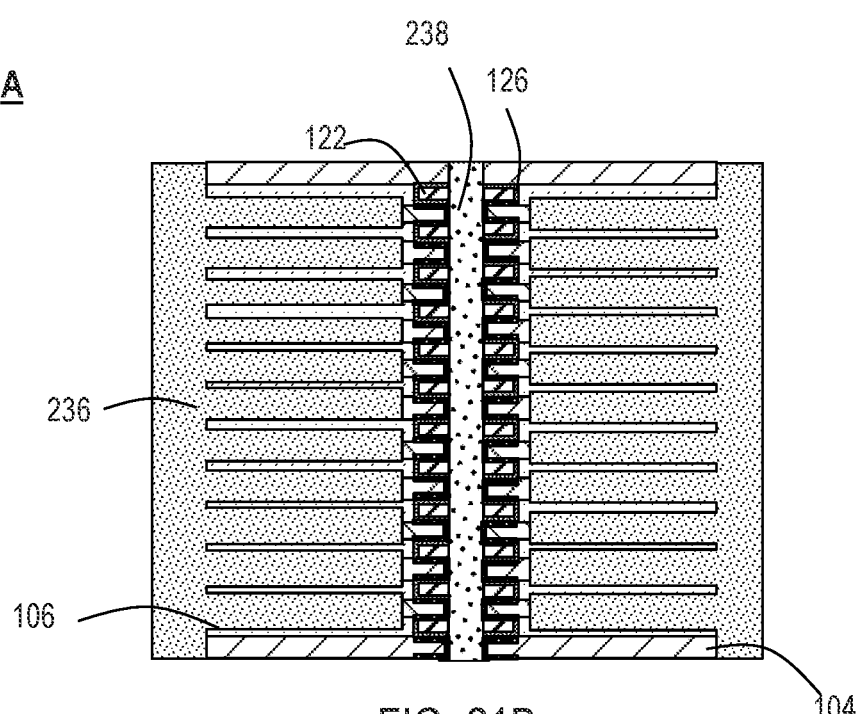
FIG. 21B illustrates a cross-sectional view of a memory device according to one or more embodiments of the disclosure.

With reference to FIGS. 21A to 21B, a bit line 238 is formed in the filled slit pattern opening. In one or more embodiments, the bit line 238 may include an optional bit line liner (also referred to as a bit line barrier layer) and a bit line metal.

The optional bit line liner can be made of any suitable material deposited by any suitable technique known to the skilled artisan. In one or more embodiments, the bit line liner is deposited on the source/drain region at the inner end of the active material. The bit line liner can be any suitable material including, but not limited to, titanium nitride (TiN) or tantalum nitride (TaN). In some embodiments, the optional bit line liner comprises or consists essentially of titanium nitride (TiN). As used in this manner, the term "consists essentially of" means that the composition of the film is greater than or equal to about 95%, 98%, 99% or 99.5% of the stated species. In some embodiments, the optional bit line liner comprises or consists essentially of tantalum nitride (TaN). In some embodiments, the bit line liner is a conformal layer. In some embodiments, the bit line liner is deposited by atomic layer deposition.

In some embodiments, the bit line 238 comprises a bit line metal. The bit line metal may comprise any suitable metal known to the skilled artisan. In one or more embodiments, the bit line metal comprises or consists essentially of one or more of tungsten silicide (WSi), tungsten nitride (WN), or tungsten (W). The bit line metal can be deposited by any suitable technique known to the skilled artisan and can be any suitable material. In one or more embodiments, forming the bit line 238 further comprises forming a bit line metal seed layer (not shown) prior to depositing the bit line metal.

Figure 22A:
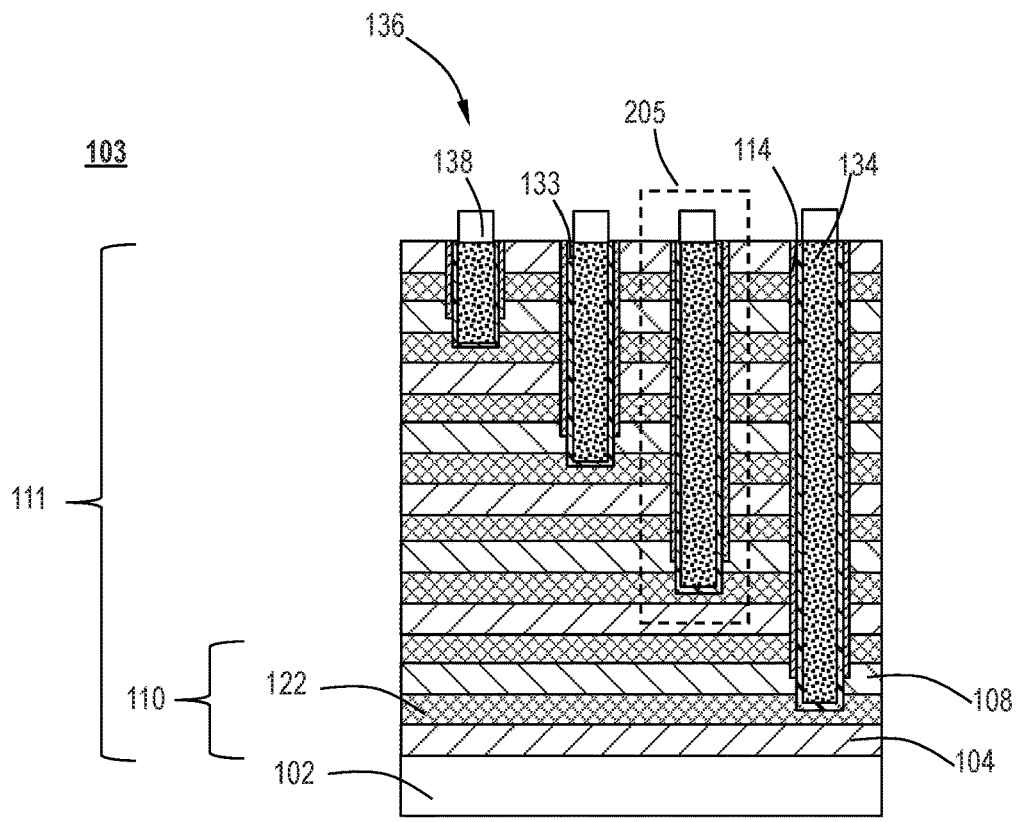
FIG. 22A illustrates a cross-sectional view of a memory device according to one or more embodiments of the disclosure.
Figure 22B:
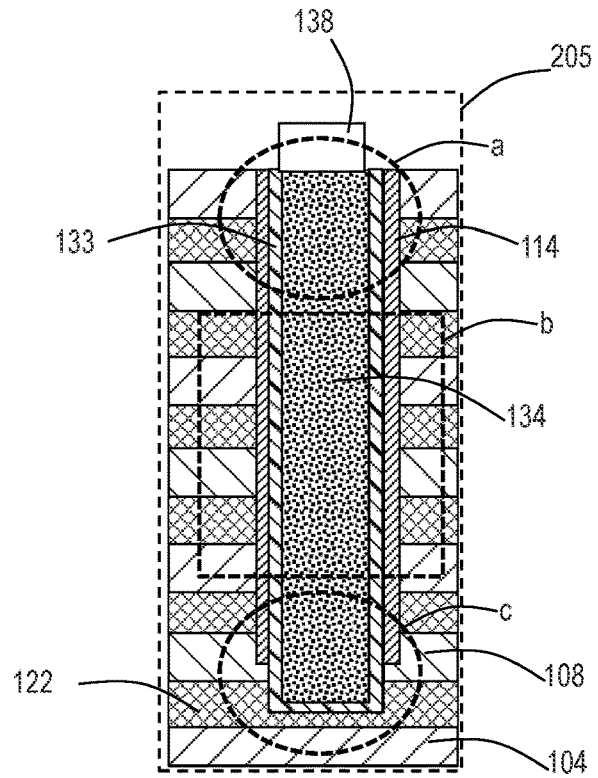
FIG. 22B illustrates a cross-sectional view of a memory device according to one or more embodiments of the disclosure.

Referring to FIGS. 22A and 22B, the extension region 103 of a 3D DRAM device connects memory cells with the non-array node of the DRAM device. In one or more embodiments, the extension region 103 comprises a memory stack 111 and a plurality of word line contacts 136. In one or more embodiments, the memory stack 111 does not comprise a staircase structure, but instead has a plurality of word line contacts 136 that are each different in height than the height of the adjacent contact.

The memory stack 111 comprises alternating layers of at least one conductive layer 122, a semiconductor layer 108, and an insulating layer 104. The plurality of word line contacts 136 extend through the memory stack 111 to the at least one conductive layer 122. Each of the plurality of word line contacts 136 has a height that is different than the height of an adjacent word line contact 136, and each of the plurality of word line contacts 136 has a metallization layer 138 on a top surface.

In one or more embodiments, each of the word line contacts 136 comprises a first region a, a second region b, and a third region c. The second region b is located between the first region a and the third region c. In one or more embodiments, the third region c is larger than the second region b.

In one or more embodiments, the first region and the third region are connected with one or more of the metallization layer 138 and the at least one conductive layer 122. The second region b may be surrounded by a liner 114. In one or more embodiments, the liner 114 is adjacent to the at least one conductive layer 122, the insulating layer 104, and the semiconductor layer 108.

Figure 23:
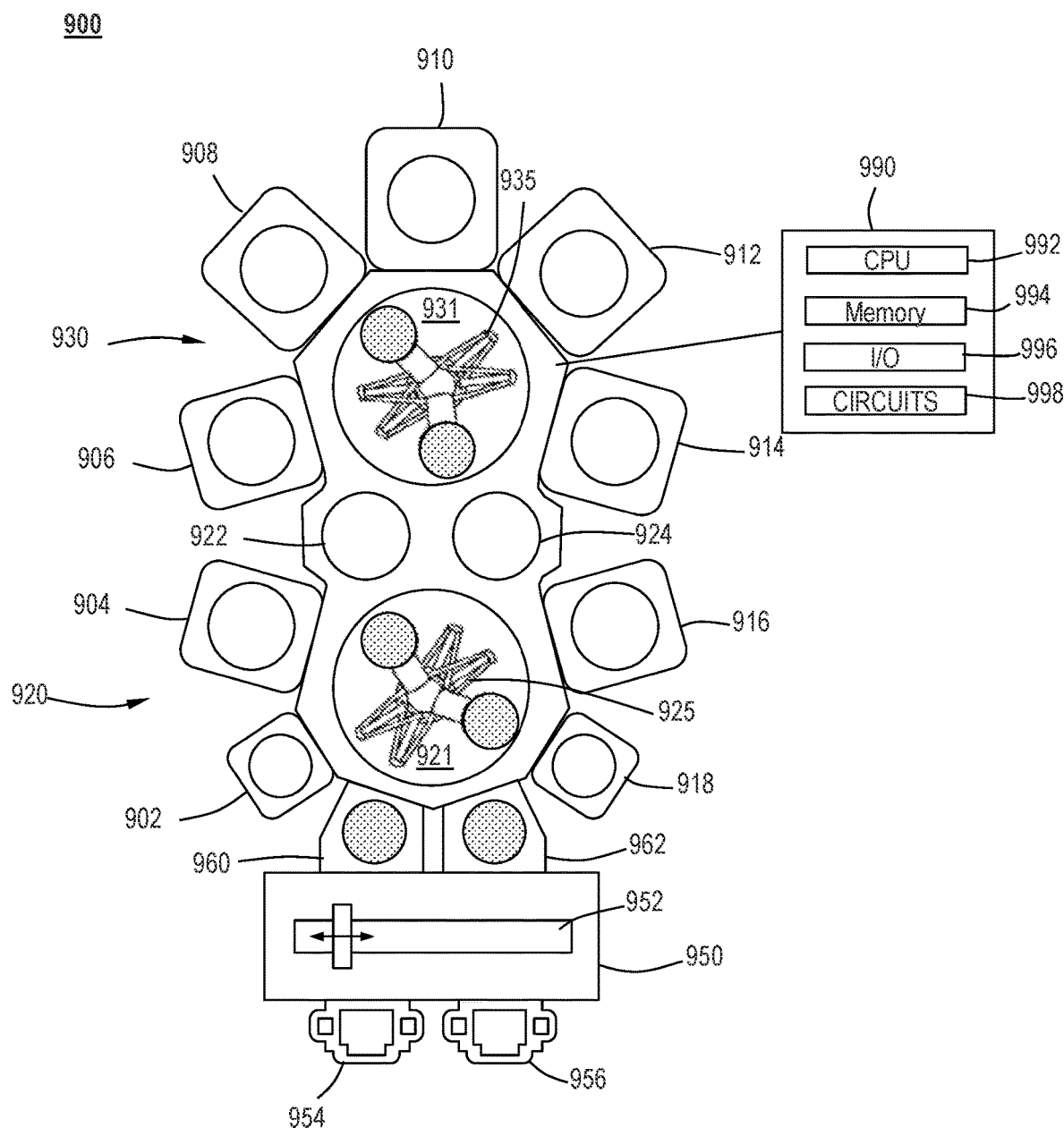
FIG. 23 illustrates a cluster tool according to one or more embodiments.

Additional embodiments of the disclosure are directed to processing tools 900 for the formation of the memory devices and methods described, as shown in FIG. 23. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective etching chamber, and the like. The particular arrangement of process chambers and components can be varied depending on the cluster tool and should not be taken as limiting the scope of the disclosure.

In the embodiment shown in FIG. 23, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU), memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A memory device comprising:
an array region comprising at least two unit cells stacked vertically; and
an extension region adjacent the array region, the extension region comprising a memory stack and a plurality of word line contacts, the memory stack comprising alternating layers of at least one conductive layer, a semiconductor layer, and an insulating layer, the plurality of word line contacts extending through the memory stack to the at least one conductive layer, each of the plurality of word line contacts having a height that is different than the height of an adjacent word line contact and each of the plurality of word line contacts having a metallization layer on a top surface.

2. The memory device of claim 1, wherein the plurality of word line contacts connect the metallization layer with the at least one conductive layer.

3. The memory device of claim 1, wherein each of the plurality of word line contacts are comprise a first region, a second region, and a third region.

4. The memory device of claim 3, wherein the first region and the third region are connected with one or more of the metallization layer and the at least one conductive layer.

5. The memory device of claim 3, wherein the second region is located between the first region and the third region.

6. The memory device of claim 3, wherein the second region is surrounded by a liner.

7. The memory device of claim 6, wherein the liner is adjacent to the at least one conductive layer, the insulating layer, and the semiconductor layer.

8. The memory device of claim 3, wherein the third region is larger than the second region.

9. The memory device of claim 1, wherein the memory device is a 3D DRAM device.

* * * * *